United States Patent
Kawai et al.

(10) Patent No.: US 6,918,730 B2
(45) Date of Patent: Jul. 19, 2005

(54) APPARATUS FOR ASSISTING OPERATOR IN PERFORMING MANUAL OPERATIONS IN CONNECTION WITH COMPONENT FEEDERS

(75) Inventors: Takayoshi Kawai, Okazaki (JP); Shinsuke Suhara, Kariya (JP); Yusuke Tsuchiya, Toyota (JP)

(73) Assignee: Fuji Machine Mfg. Co., Ltd., Chiryu (JP)

( * ) Notice: Subject to any disclaimer, the term of this patent is extended or adjusted under 35 U.S.C. 154(b) by 349 days.

(21) Appl. No.: 10/086,526

(22) Filed: Mar. 4, 2002

(65) Prior Publication Data

US 2002/0124391 A1 Sep. 12, 2002

(30) Foreign Application Priority Data

Mar. 6, 2001 (JP) ........................................ 2001-062183

(51) Int. Cl.[7] .................... B23P 19/00; H05K 13/02
(52) U.S. Cl. .................... 414/183; 414/278; 414/937
(58) Field of Search ........................... 414/403, 183, 414/217, 278, 935, 937; 29/701

(56) References Cited

U.S. PATENT DOCUMENTS

| 4,869,813 | A | * | 9/1989 | Bailey et al. ............... 414/278 |
| 5,283,943 | A | | 2/1994 | Aguayo et al. |
| 5,325,305 | A | | 6/1994 | Rezaei |
| 6,027,019 | A | | 2/2000 | Kou |
| 6,099,598 | A | * | 8/2000 | Yokoyama et al. .......... 414/278 |

\* cited by examiner

Primary Examiner—Douglas Hess
(74) Attorney, Agent, or Firm—Oliff & Berridge, PLC

(57) ABSTRACT

An apparatus for assisting an operator of an electric-component supply device including component feeders mounted on feeder support and each accommodating electric components, the apparatus including (a) a position indicator operable to indicate the feeder-mounting position at which the component feeder is to be mounted on the feeder support, and/or the feeder-mounting position at which the component feeder has been removed from the feeder support, and/or (b) a feeder indicator operable to indicate at least one of (i) the component feeder which has been mounted on the feeder support, (ii) the component feeder which is to be removed from the feeder support and (iii) the component feeder on which an intermediate operation is required to be performed between moments of the operations to mount and remove the component feeder on and from the feeder support.

17 Claims, 14 Drawing Sheets

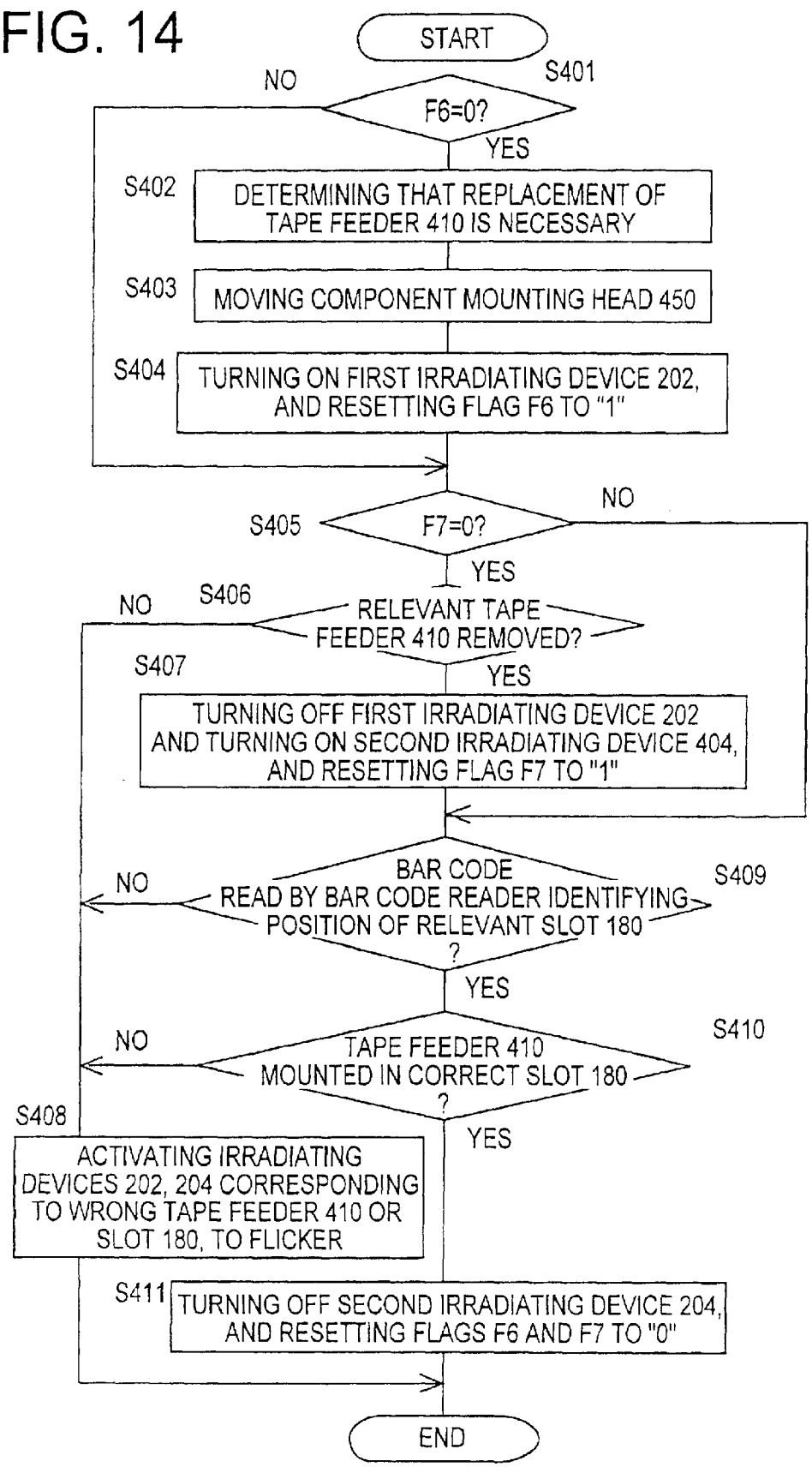

APPARATUS FOR ASSISTING OPERATOR IN PERFORMING MANUAL OPERATIONS IN CONNECTION WITH COMPONENT FEEDERS

BACKGROUND OF THE INVENTION

1. Field of the Invention

The present invention relates to an operator assisting apparatus arranged to assist an operator of an electric-component supply device including a plurality of component feeders and feeder support on which the component feeders are mounted at respective feeder-mounting positions. Each of the component feeders accommodates a plurality of electric components (typically, electronic components) of a specific kind, and is arranged to successively supply the electric components one after another. The operator assisting apparatus is arranged to assist the operator in performing manual working operations such as mounting or setting and removal of the component feeders on and from the feeder support, so as to avoid erroneous or inadequate manual working operations or improve the working efficiency.

2. Discussion of Related Art

To maintain such an electric-component supply device in an operable condition, the operator is usually required to perform manual working operations such as mounting and removal of a plurality of component feeders, and intermediate working operations in connection with the component feeders, which are performed during a time period between the moments of the mounting and removing operations of the component feeders. Conventionally, the feeder-mounting positions at which the manual working operations are required to be performed by the operator are indicated by respective identification numbers indicated on a display screen of a display device, or alternatively, the feeder-mounting positions are indicated by moving the feeder support so that the relevant feeder-mounting positions are aligned with an indicator arrow printed on an adhesive film bonded to a stationary structure. Thus, the operator is prompted to perform the required manual working operation at each feeder-mounting position indicated on the display screen or by the indicator arrow. However, there is a risk that the operator erroneously reads the identification number indicated on the display screen, or fails to correctly recognize the feeder-mounting position indicated by the indicator arrow, due to observation of the indicator arrow in a direction not parallel to the pointing direction of the arrow. In such events, the operator may not perform the manual working operation at the correct feeder-mounting position, for instance, may perform the working operation (mounting or removal of the component feeder or intermediate working operation) at the feeder-mounting position next to the correct position. This risk has been increasing with an increasing tendency toward a dense arrangement of the component feeders on the feeder support with a shorter spacing pitch of the component feeders.

SUMMARY OF THE INVENTION

The present invention was made in view of the background art discussed above. It is therefore an object of the present invention to provide an operator assisting apparatus which permits easy, correct recognition by the operator of an electric-component supply device, of the feeder-mounting position at which the next manual working operation is required to be performed by the operator, or which assures an improvement in the manual working operation in connection with the electric-component-supply device. This object may be achieved by any one of the following modes of the present invention in the form of an operator assisting apparatus. Each of the following modes of the invention is numbered like the appended claims and depends from the other mode or modes, where appropriate, to indicate and clarify possible combinations of elements or technical features. It is to be understood that the present invention is not limited to the specific technical features or any combination thereof, which will be described for illustrative purpose only. It is to be further understood that a plurality of elements or features included in any one of the following modes of the invention are not necessarily provided all together, and that the invention may be embodied without some of the elements or features described with respect to the same mode.

(1) An operator assisting apparatus for assisting an operator of an electric-component supply device including a plurality of component feeders and feeder support on which the component feeders are mounted at respective feeder-mounting positions, each of the component feeders accommodating a plurality of electric components of a specific kind and being arranged to successively supply the electric components one after another, the operator assisting apparatus being arranged to assist the operator in performing at least one manual working operation selected from among an operation to mount the component feeders on the feeder support, an operation to remove the component feeders from the feeder support, and an intermediate operation to be performed in connection with the component feeders, during a time period between moments of the operations to mount and remove the component feeders on and from the feeder support, the operator assisting apparatus comprising:

at least one of (a) a position indicator operable to at least one of the feeder-mounting position at which a corresponding one of the component feeder is to be mounted next on the feeder support and the feeder-mounting position at which a corresponding one of the component feeders has been removed last from the feeder support, and (b) a feeder indicator operable to indicate at least one of (i) the component feeder which has been mounted last on the feeder support, (ii) the component feeder which is to be removed next from the feeder support and (iii) the component feeder on which the intermediate operation is required to be performed.

Each of the position indicator and the feeder indicator may be a physical or optical indicator capable of physically or optically indicating the relevant feeder-mounting position or the relevant component feeder. The physical indicator may be an indicator which is movable relative to the feeder support in the direction in which the plurality of component feeders are arranged on the feeder support. Alternatively, the physical indicator may be a plurality of movable members which are movable on the feeder support, between advanced and retracted positions. The optical indicator may be a light-emitter, a projector or an irradiating device, or an indicator lamp or light. The light-emitter, projector or irradiating device are arranged to irradiate a selected portion of the electric-component supply device which corresponds to the relevant feeder-mounting position or the relevant component feeder. A plurality of indicator lamps or lights are provided for the respective feeder-mounting positions or component feeders, and are controlled to be turned on or off, or to flicker. The intermediate operation as one of the manual working operations may include: an operation to remove a defect or trouble of the electric-component supply device such as jamming of the electric components in the component feeder: an operation to splice a new component carrier tape to a presently used component carrier tape such that the leading end portion of the new component carrier tape is connected to the trailing end portion of the presently used component carrier tape; and an operation to remove a suitable length of a covering tape from a covering-tape storage container. The component carrier tape accommodates a plurality of electric components (typically, electronic components) such that the electric components are spaced apart from each other in the direction of length of the component carrier tape. The covering tape is provided to close the openings of a plurality of recesses which are formed in the component carrier tape and which accommodate the respective electric components. As the component carrier tape is fed to successively supply the electric components, the covering tape is separated from the component carrier tape, and the separated length of the covering tape is stored in the covering-tape storage container.

The present operator assisting apparatus, which is arranged to directly indicate the relevant component feeder or the relevant feeder-mounting position, permits more effective prevention of manual working operations on the wrong component feeders or at the wrong component-mounting positions, than the conventional apparatus which suffers from erroneous reading of the identification numbers of the feeder-mounting positions indicted on the display screen, or erroneous recognition of the feeder-mounting positions as indicated by the indicator arrow. The present operator assisting apparatus permits accordingly effective prevention of mounting of wrong electric components on printed-wiring boards, and assures improved efficiency of the manual working operations by the operator.

(2) An operator assisting apparatus according to the above mode (1), which comprises the position indicator, to assist the operator in performing the operation to mount the component feeders on the feeder support.

(3) An operator assisting apparatus according to the above mode (1) or (2), further comprising a mounting-position checking and indicating device for effecting a determination as to whether the component feeder mounted last on the feeder support has been mounted at a correct one of the feeder-mounting positions, and for indicating in a human-recognizable manner a result of the above-indicated determination.

The mounting-position checking and indicating device may include a detecting device of non-contact type operable to effect the above-indicated determination, without a contact with the relevant component or a detecting device of contact type operable to effect the above-indicated determination, by contacting the relevant component feeder. The detecting device of non-contact type is preferably selected from among various proximity switches, and various photoelectric switch of light-reflecting or light-transmission type each including a light-emitting element and a light-receiving element.

The mounting-position checking and indicating device provides an indication that the relevant component feeder has been mounted at the wrong feeder-mounting position, so that the mounting of the component feeder at the wrong feeder-mounting position can be prevented with increased reliability. When the mounting-position checking and indicating device has provided the indication that the relevant component feeder has been mounted at the wrong feeder-mounting position, the feeder indicator and the position indicator may be arranged not to provide a next indication of any component feeder or any feeder-mounting position, unless the mounting-position checking and indicating device has determined that the relevant component feeder has been re-mounted by the operator at the correct feeder-mounting position.

(4) An operator assisting apparatus according to the above mode (3), which comprises the feeder indicator, and wherein the mounting-position checking and indicating device utilizes the feeder indicator, to indicate the result of said determination.

The mounting-position checking and indicating device may include a display device arranged to indicate the result of the above-described determination on its display screen. In the operator assisting apparatus according to the above mode (4), however, the mounting-position checking and indicating device utilizes the feeder indicator, so that the apparatus is available at a reduced cost. Further, the utilization of the feeder indicator permits a direct determination as to whether the relevant component feeder has been mounted at the correct feeder-mounting position. Accordingly, the present arrangement is further effective to prevent the electric-component supply device from supplying wrong electric components due to mounting of the component feeders at the wrong feeder-mounting positions.

(5) An operator assisting apparatus according to the above mode (4), wherein the mounting-position checking and indicating device is operable to control the feeder indicator to be operable in a last-mounting upon a last-mounting determination that the component feeder mounted last on the feeder support has been mounted at the correct feeder-mounting position, and in a non-last-mounting different from the last-mounting mode, upon a non-last-mounting determination that the component feeder mounted last on the feeder support has not been mounted at the correct feeder-mounting position.

Where a light-emitting, projecting or irradiating device is used as the feeder indicator, for example, the different first and second modes indicated above may be a combination of a mode in which the light-emitting device continuously emits a light, and a mode in which the light-emitting device intermittently emits a light. Alternatively, the first and second modes may be a combination of a mode in which the light-emitting device is operated to emit a light, and a mode in which the light-emitting device is not in operation. Further alternatively, the first and second modes may be a combination of two modes in which the light-emitting device emits lights of respective different colors. The above descriptions of the first and second modes are also applicable to an indicator lamp or light provided as the feeder indicator. Where a movable indicator is used as the feeder indicator, the first and second modes may be a combination of a mode in which the movable indicator is held at the advanced position to indicate the relevant feeder-mounting position or the relevant component feeder, and a mode in which the movable indicator is oscillating to and from the advanced position, for example, oscillating between the advanced and retracted positions.

(6) An operator assisting apparatus according to any one of the above modes (1)–(5), which comprises the feeder indicator, to assist the operator in performing the operation to remove the component feeders from the feeder support.

(7) An operator assisting apparatus according to any one of the above modes (1)–(6), which comprises the position indicator, and further comprises a removing-position checking and indicating device operable to control the position indicator to be operable in a removing manner upon a removing determination that the component feeder removed last from the feeder support has been removed from a correct one of the feeder-mounting positions, and in a non-removing manner different from the removing manner, upon a non-removing determination that the component feeder removed last from the feeder support has not been removed from the correct feeder-mounting position.

(8) An operator assisting apparatus according to any one of the above modes (1)–(7), which comprises said feeder indicator, to assist the operator in performing the intermediate operation.

(9) An operator assisting apparatus according to any one of the above modes (1)–(8), which comprises the feeder indicator, and further comprises:

a need detecting device operable to detect a need of performing the intermediate operation;

an operation detecting device operable to detect that said intermediate operation has been performed in connection with any one of said component feeders; and an intermediate-operation checking and indicating device operable according to an output of the operation detecting device, to control the feeder indicator for indicating the component feeder in connection with which the intermediate operation has been performed, such that the feeder indicator is operable in an intermediate manner upon an intermediate determination that the intermediate operation has been performed at a correct one of the feeder-mounting positions, and a non-intermediate different from the, upon a non-intermediate determination that the intermediate operation has not been performed at the correct feeder-mounting position.

(10) An operator assisting apparatus according to any one of the above modes (1)–(9), which comprises the feeder indicator, and further comprises:

a need detecting device operable to detect a need of performing the intermediate operation;

an operation detecting device operable to detect that the intermediate operation has been performed in connection with any one of the component feeders; and an intermediate-operation checking and indicating device operable according to an output of the need detecting device, to control the feeder indicator to be operable in a needing manner upon a needing determination that the intermediate operation which has been performed is the intermediate operation the need of which has been detected by the need detecting device, and in a non-needing different from the needing manner, upon a non-needing determination that the intermediate operation which has been performed is different from the intermediate operation the need of which has been detected by the need detecting device.

(11) An operator assisting apparatus according to any one of the above modes (1)–(10), further comprising next-operation determining means for determining the manual working operation which should be performed next by the operator, and the component feeder for which the determined manual working operation should be performed next, the manual working operation being one of the operation to mount any one of the component feeders on the feeder support, the operation to remove any one of the component feeders from the feeder support, and the intermediate operation in connection with any one of the component feeders.

(12) An operator assisting apparatus according to the above mode (11), wherein the next-operation determining means includes need detecting means (474, 500) for detecting a need of performing at least one of the operation to mount any one of the component feeders at the corresponding feeder-mounting position, the operation to remove any one of the component feeders mounted at the corresponding feeder-mounting position, and the intermediate operation in connection with any one of the component feeders.

When the need detecting means has detected a need of performing any operation in connection with any component feeder, the position indicator and/or the feeder indicator indicates the relevant feeder-mounting position or component feeder. In this respect, the position indicator and/or the feeder indicator may be considered to function as control means for controlling the indication of the relevant feeder-mounting position or component feeder. Alternatively, the next-operation determining means may be considered to include control means for controlling the position indicator and/or the feeder indicator, depending upon an output of the need detecting means.

(13) An operator assisting apparatus according to the above mode (11) or (12), wherein the plurality of component feeders are provided with respective sets of feeder-identification data identifying the component feeders, respectively, and the next-operation determining means includes:

feeder-identification-data obtaining means for obtaining said sets of feeder-identification data of the component feeders; and operation-data storing means for storing operation data indicative of the manual working operation to be performed by the operator in connection with the component feeder whose set of feeder-identification data has been obtained by the feeder-identification-data obtaining means, and wherein the next-operation determining means determines the manual working operation represented by the operation data stored in the operation-data storing means, as the manual working operation which should be performed next in connection with the component feeder whose set of feeder-identification data which has been obtained by the feeder-identification-data obtaining means.

The feeder-identification-data obtaining means may be identification-code reading means for reading identification codes provided on the respective component feeders, or identification-data reading means for reading from memory means the feeder-identification data sets identifying the respective component feeders, according to a predetermined rule. Alternatively, the feeder-identification-data obtaining means may be identification-data receiving means for receiving from an external device the feeder-identification data sets identifying the respective component feeders. The identification-code reading means may be a code reader, such as a bar code reader, which is operated by the operator. The identification-data reading means may be means for executing a control program prepared for controlling an electric-component mounting system including the present operator assisting apparatus. The external device from which the feeder-identification data sets are received by the identification-data receiving means may be an input device operable by the operator, or a host computer. The feeder-identification data may take the form of at least one of: letters such as Japanese phonetic "katakana" letters and alphabetic letters; numerals such as Arabic numerals; and symbols such as parentheses and hyphen.

(14) An operator assisting apparatus according to any one of the above modes (11)–(13), wherein the feeder support is provided with sets of position-identification data representative of the plurality of feeder-mounting positions, respectively, and the next-operation determining means includes:

position-identification-data obtaining means for obtaining the sets of position-identification data of the feeder-mounting positions; and operation-data storing means for storing operation data indicative of the manual working operation to be performed by the operator at the feeder-mounting position represented by the set of position-identification data obtained by the position-identification-data obtaining means, and wherein the next-operation determining means determines the manual working operation represented by the operation data stored in the operation-data storing means, as the manual working operation which should be performed next at the feeder-mounting position represented by the set of position-identification data obtained by the position-identification-data obtaining means.

The position-identification-data obtaining means may be identification-code reading means for reading identification codes provided at the respective feeder-mounting positions, or identification-data reading means for reading from memory means the position-identification data sets representative of the respective feeder-mounting positions, according to a predetermined rule. Alternatively, the position-identification-data obtaining mean may be identification-data receiving means for receiving from an external device the position-identification data sets representative of the feeder-mounting positions. The identification-code reading means may be a code reader, such as a bar code reader, which is operated by the operator. The identification-data reading means may be means for executing a control program prepared for controlling an electric-component mounting system including the present operator assisting apparatus. The external device from which the position-identification data sets are received by the identification-data receiving means may be an input device operable by the operator, or a host computer. The position-identification data may be located on the feeder support such that the set of position-identification data is not readable when the corresponding component feeder is mounted on the feeder support, or such that the set of position-identification data is readable even after the corresponding component feeder is mounted on the feeder support.

(15) An operator assisting apparatus according to any one of the above modes (1)–(14), wherein at least one of the position indicator and the feeder indicator includes optical indicator for indicating the feeder-mounting position or the component feeder, by generation of a light.

(16) An operator assisting apparatus according to the above mode (15), wherein the optical indicator includes at least one of an irradiating device operable to irradiate an object with a light, and a light-emitting device disposed on an object and operable to emit a light.

BRIEF DESCRIPTION OF THE DRAWINGS

The above and other objects, features, advantages and technical and industrial significance of the present invention will be better understood by reading the following detailed description of presently preferred embodiments of the invention, when considered in connection with the accompanying drawings, in which:

FIG. 14 is a flow chart illustrating a feeder replacement assisting program stored in the computer of the control device of the system of FIG. 9.

DETAILED DESCRIPTION OF THE PREFERRED EMBODIMENTS

Figure 1:
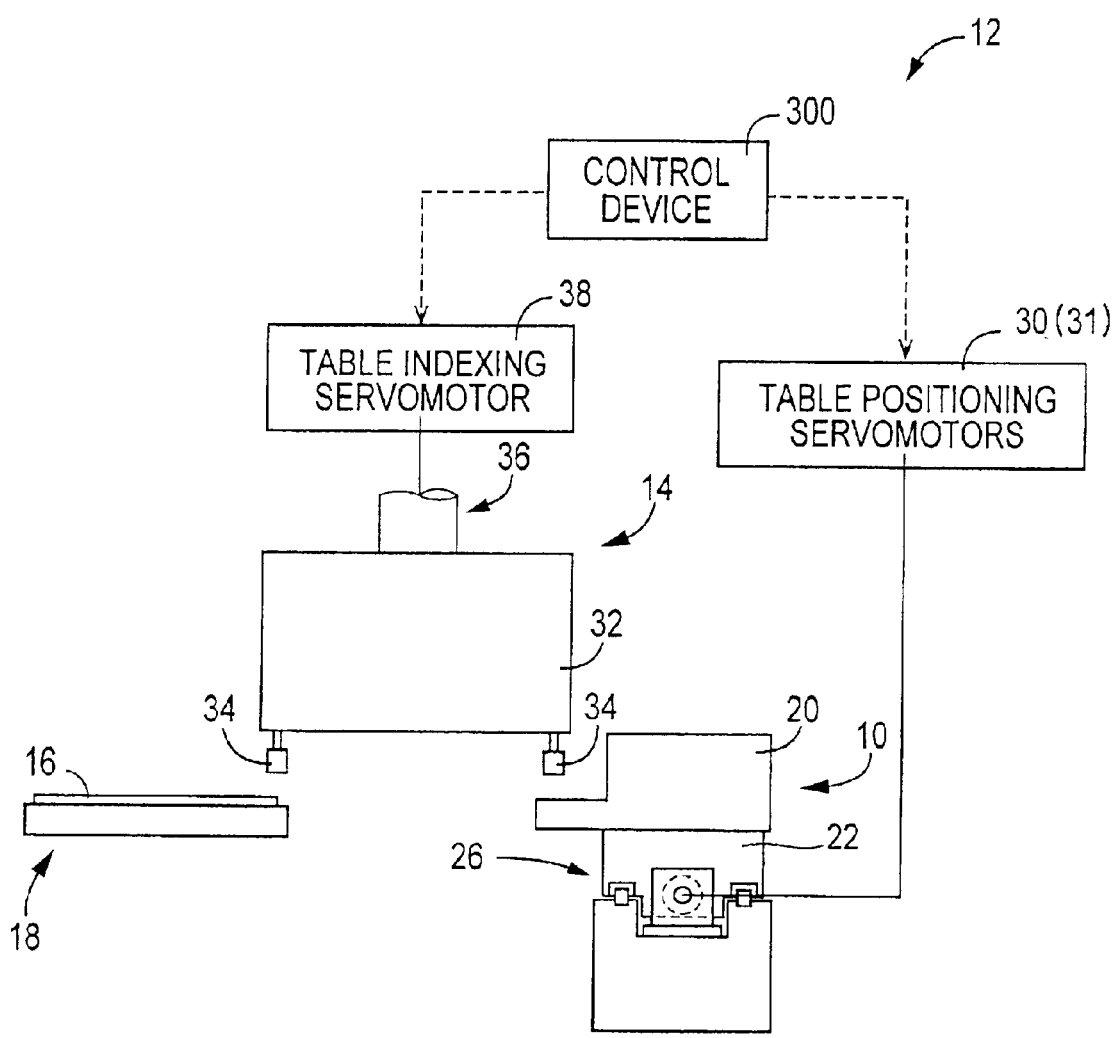
FIG. 1 is a view schematically illustrating an electronic-component mounting system incorporating an operator assisting apparatus constructed according to one embodiment of this invention, to assist an operator of the system in performing manual working operations in connection with component feeders.
Figure 2:
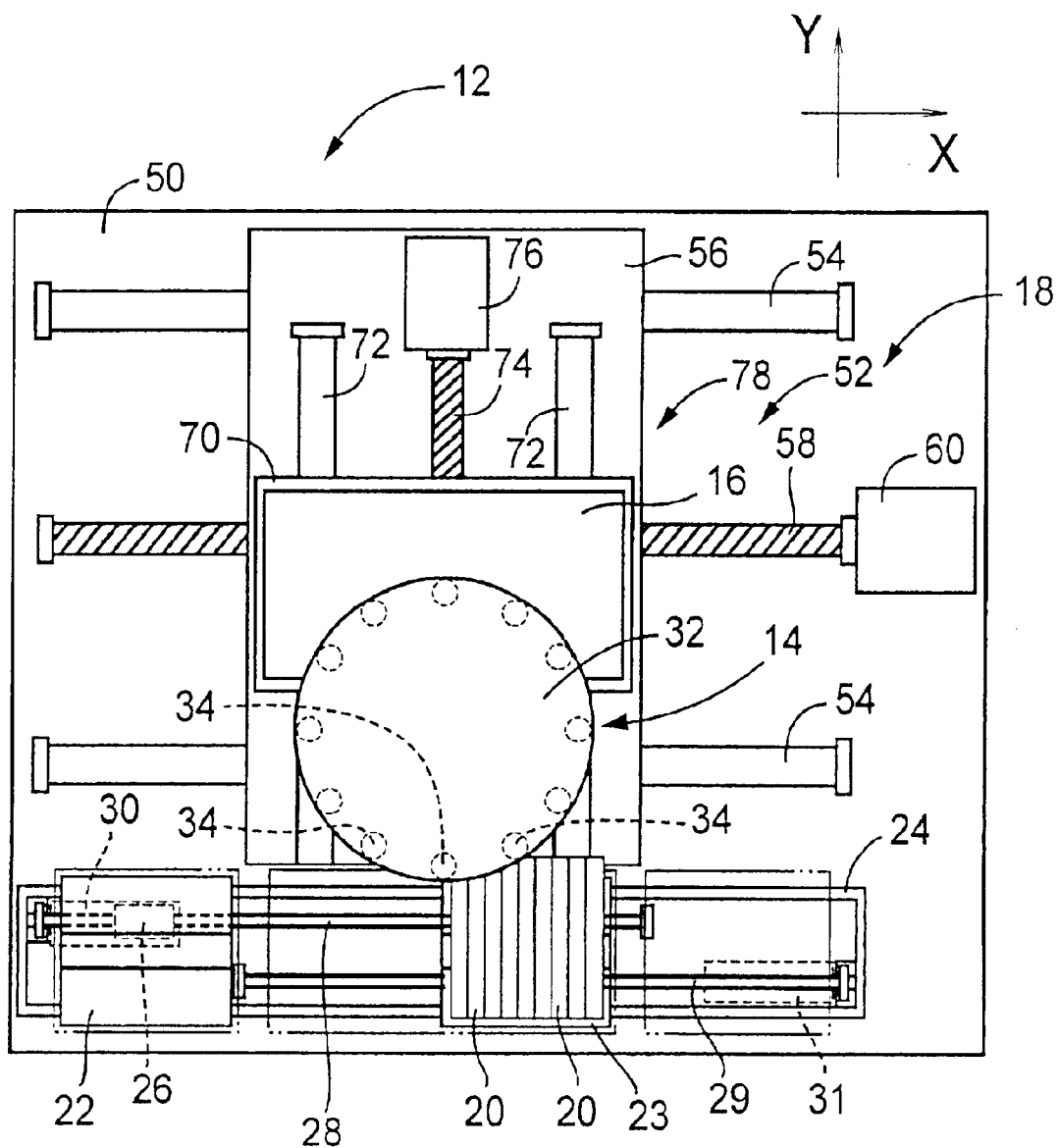
FIG. 2 is a plan view of the electronic-component mounting system of FIG. 1.

Referring first to FIGS. 1 and 2, there is schematically illustrated an electric-component mounting system in the form of an electronic-component mounting system 12 including an electronic-component supply device 10 provided with an operator assisting apparatus constructed according to one embodiment of this invention. The electronic-component mounting system 12 further includes an electronic-component mounting device 14 arranged to mount electronic components on a printed-wiring board 16, and a supporting and positioning device 18 arranged to support and position the printed-wiring board 16. The electronic-component supply device 10 is provided with a multiplicity of component feeders in the form of tape feeders 20 arranged to supply the electronic-component mounting device 14 with the electronic components. The electronic-component mounting device 14 is operated to receive the electronic components from the electronic-component supply device 10, and mount the electronic components on the printed-wiring board 16 which is supported and positioned by the supporting and positioning device 18.

The multiplicity of tape feeders 20 of the electronic-component supply device 10 are removably mounted on a feeder support in the form of a first table 22 and a second table 23, such that component-supply portions of the tape feeders 20 are arranged along a horizontal straight line as shown in FIG. 2. The first and second tables 22, 23 are movably supported by a pair of guide rails 24 which are disposed so as to extend in an X-axis direction parallel to the above-indicated straight line. The first and second tables 22, 23 are provided with respective ballnuts 26 fixed to their lower surfaces. These ballnuts 26 are held in engagement with respective feed screws in the form of ballscrews 28, 29, which are disposed so as to extend in parallel with the guide rails 24. The ballscrews 28, 29 are disposed such that they are not axially movable, but are rotatable by respective drive motors in the form of table positioning servomotors 30, 31 that are controlled independently of each other to move the first and second tables 22, 23 independently of each other.

The electronic-component mounting system 12 has a component-supply position at a longitudinally central position of the guide rails 24. When the given electronic components are mounted on the printed-wiring board 16, the first and second table 22, 23 are moved to successively locate the component-supply portions of the appropriate tape feeders 20 accommodating those electronic components, at the component-supply position. The maximum distance of movement of each table 22, 23 is equal to a distance between the positions of the two tape feeders 20 mounted at the opposite ends of the table 22, 23, and a common component-supply area of the tables 22, 23 for supplying the electronic components is defined by the position of the tape feeder 20 at one of the opposite ends of the table 22, 23 when the tape feeder 20 at the other end of the table is located at the component-supply position, and the position of the tape feeder 20 at the above-indicated other end when the tape feeder 20 at the above-indicated one end is located at the component-supply position. During a series of component mounting operation of the electronic-component mounting system 12, the tape feeders 20 mounted on a selected one of the two tables 22, 23 are used with the selected table 22, 23 being moved within the common component-supply area, while the other table 22, 23 is held at a standby position located on one side of the common component-supply area, to avoid an interference with the selected table 22, 23. Namely, the two standby positions (indicated by two-dot chain lines in FIG. 2) for the respective two tables 22, 23 are provided on the opposite sides of the common component-supply area (also indicated by two-dot chain lines). The two guide rails 24 have a length large enough to permit the two tables 22, 23 to move between the common component-supply area and the two standby positions. In the example of FIG. 2, the first table 22 is held at its standby position, while the second table 23 is located at one end of the common component-supply area. The guide rails 24 serve as a guiding device for guiding the two tables 22, 23.

The electronic-component mounting device 14 includes an indexing table 32 supported by a frame (not shown) such that the indexing table 32 is rotatable about a vertical axis. The indexing table 32 carries a plurality of component mounting heads 34 such that the component mounting heads 34 are arranged equiangularly along a circle having a center at the axis of rotation of the indexing table 32. The indexing table 32 is intermittently rotated by a rotary drive device 36, by a predetermined angle corresponding to the angular spacing pitch of the component mounting heads 34, in each intermittent rotary motion, so that the component mounting heads 34 are sequentially moved to and stopped at a plurality of working positions (stations), which include a component-receiving position (corresponding to the above-indicated component-supply position of the electronic-component supply device 10), and a component-mounting position at which the electronic components are mounted on the printed-wiring board 16. The rotary drive device 36 includes a rotary drive device in the form of a table indexing servomotor 38, and a cam device. The cam device includes a barrel cam, and a plurality of rollers, and is arranged to convert a continuous rotary motion of the table indexing servomotor 38 into an intermittent rotary motion of the indexing table 32.

Each of the plurality of component mounting heads 34 includes a suction nozzle operable to hold an electronic component by suction under a reduced pressure. The heads 34 are turned about the axis of rotation of the indexing table 32 and are vertically moved (elevated and lowered) as the indexing table 32 is rotated.

The supporting and positioning device 18 is disposed on a machine base 50, together with the electronic-component supply device 10, as shown in FIG. 2. The supporting and positioning device 18 includes an XY table 52 which is movable in the X-axis direction and a Y-axis direction perpendicular to the X-axis direction. The XY table 52 has an X-axis slide 56 and a Y-axis slide 70. The X-axis slide 56 is slidably movable on a pair of guide rails 54 extending in the X-axis direction, while the Y-axis slide 70 is disposed on the X-axis slide 56 such that the Y-axis slide 70 is movable relative to the X-axis slide 56 in the Y-axis direction. The X-axis slide 56 is moved in the X-axis direction by a ballscrew 58 extending in the X-axis direction, and a drive source in the form of an X-axis drive servomotor 60. On the X-axis slide 56, there are disposed a pair of guide rails 72 extending in the Y-axis direction, and the Y-axis slide 70 is slidably supported by the guide rails 72. The Y-axis slide 70 is moved in the Y-axis direction by a ballscrew 74 extending in the Y-axis direction, and a drive source in the form of a Y-axis drive servomotor 76.

Figure 4:
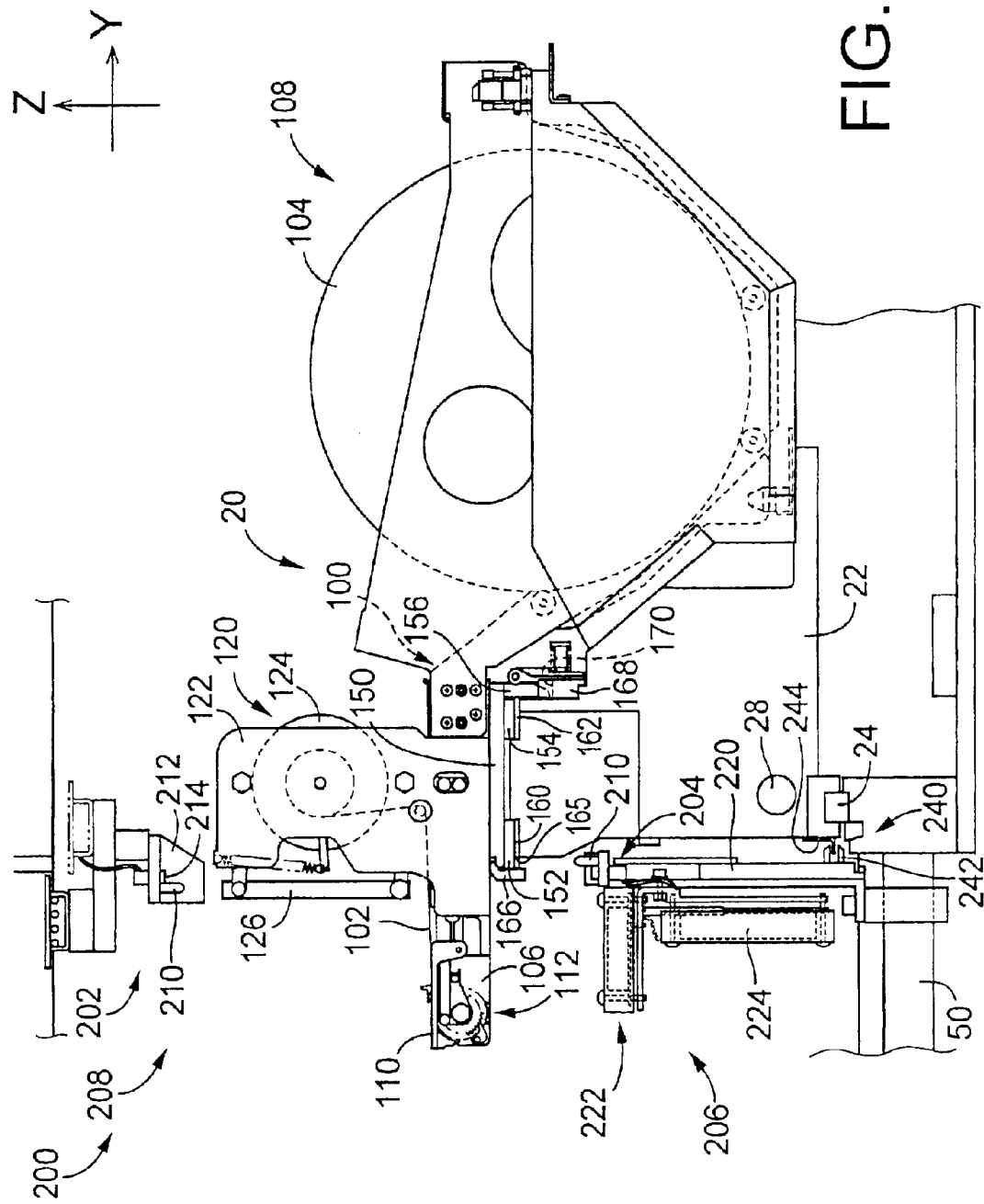
FIG. 4 is a side elevational view showing the operator assisting apparatus and one of the feeders.

The electronic-component supply device 10 will be described in more detail. In the present embodiment of the invention, each tape feeder 20 is arranged to feed a carrier tape 100 (shown in FIG. 4). The carrier tape 100 consists of a substrate tape (not shown) and a covering tape 102 shown in FIG. 4. The substrate tape has a multiplicity of component-accommodating recesses formed such that the recesses are equally spaced apart from each other in the longitudinal direction of the substrate tape. The recesses accommodate respective electronic components. The openings of the recesses are closed by the covering tape 102. As shown in FIG. 4, the tape feeder 20 includes a reel 104 which carries a roll of the carrier tape 100. The reel 104 is supported by a reel support 108 fixed at a rear end of a feeder body 106, which rear end is remote from the electronic-component mounting device 14. Since the reel support 108 does not directly relate to the present invention, no further description of the reel support 108 is deemed necessary for understanding the present invention. p The feeder body 106 is a generally elongate plate disposed on the table 22, 23 such that the directions of length and thickness of the plate are parallel to a horizontal plane. A cover 110 is disposed so as to extend in parallel with the upper surface of the feeder body 106, and a leading end portion of the carrier tape 100 is inserted between on the upper surface of the feeder body 106 and under the cover 110. The carrier tape 100 is intermittently fed on the upper surface of the feeder body 106 by a predetermined incremental distance in the Y-axis direction (perpendicular to the X-axis direction and parallel to the direction of length of the feeder body 106), by a feeding device 112 which will be described. The direction of length of the feeder body 106 is parallel to the direction of feeding of the carrier tape 100 by the tape feeder 20, and the direction of thickness (width) of the feeder body 106 is parallel to the direction of movement of the first and second tables 22, 23. The feeding device 112 is arranged to feed the carrier tape 100 in the forward direction by the predetermined distance, together with the cover 110, and move only the cover 110 in the reverse direction by the same distance with the carrier tape 100 held stationary, so as to prepare for the next cycle of feeding of the carrier tape 100. Thus, the cover 110 is reciprocated in each cycle of feeding.

To the feeder body 106, there is attached a covering-tape take-up device 120 through a bracket 122. The take-up device 120 includes a take-up reel 124, and is arranged such that the take-up reel 124 is held stationary to prevent it from taking up the carrier tape 100 while the carrier tape 100 is fed, and such that the take-up reel 124 is rotated to take up the covering tape 102 while the cover 110 is moved in the reverse direction by the feeding device 112 to prepare for the next cycle of feeding of the carrier tape 100.

The feeding device 112 and the covering-tape take-up device 120 are driven by a drive device which utilizes the table indexing servomotor 38 as a drive source. That is, the drive device includes a motion converting mechanism which includes a cam and a cam follower and which is arranged to convert a rotary motion of the table indexing servomotor 38 into a vertical reciprocating movement of an elevator member (not shown) so that an input bar 126 attached to the bracket 122 is vertically reciprocated to operate the feeding device-112 and the take-up device 120. Since the feeding of the carrier tape 100 and the operation to take up the covering tape 102 do not directly relate to the present invention, no further description is deemed necessary.

Figure 3:
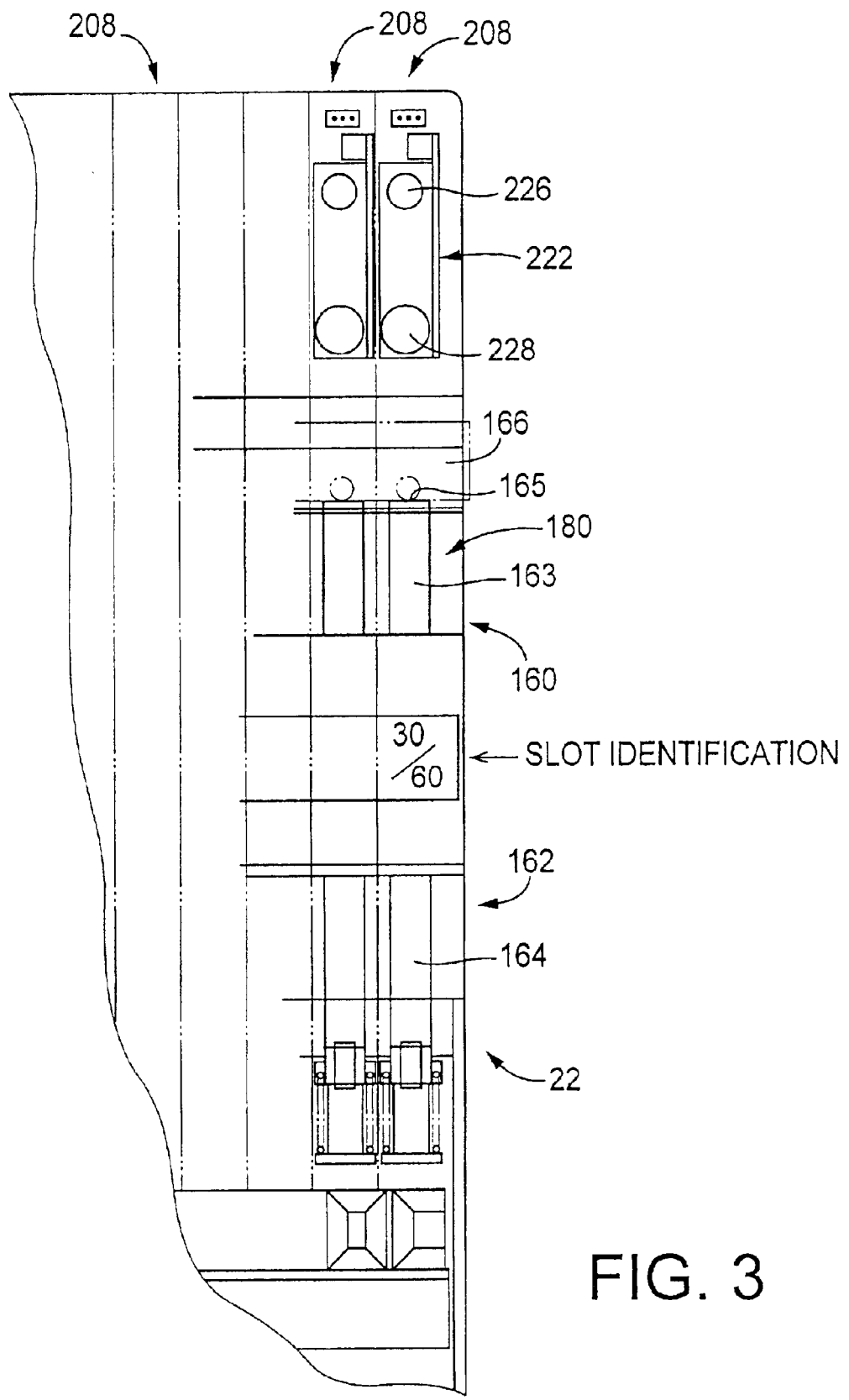
FIG. 3 is a plan view showing a part of the operator assisting apparatus.

Referring to FIGS. 3 and 4, there will be described devices for mounting the tape feeders 20 on the first and second tables 22, 23. Since the device for mounting each tape feeder 20 on the second table 23 is identical in construction with the device for mounting each tape feeder 20 on the first table 22, the following description refers to the device for the first table 22 only, by way of example. To the underside of the feeder body 106, there is bolted a mounting member 150 in the form of a plate which has the same thickness (width) as the feeder body 106. While the feeder body 106 is formed of an aluminum alloy and has a comparatively small weight, the mounting member 150 is formed of a carbon steel material (S50C) suitable for a mechanical structure, and is hardened. The mounting member 150 has a first and a second positioning projection 152, 154 which are spaced apart from each other in the longitudinal direction of the tape feeder 20, that is, in the Y-axis direction. These positioning projections 152, 154 have a rectangular shape in transverse cross section, and a thickness or width dimension smaller than that of the mounting member 150. Each of the positioning projections 152, 154 is located at a central part of the mounting member as seen in the direction of thickness.

A first inclined surface is formed in the front end portion of the upper surface of the mounting member 150. This front inclined surface is inclined upwards as this surface extends rearwards. The mounting member 150 further has a third positioning projection 156 at it rear end. This third positioning projection 156 is a plate having the same thickness as the first positioning projection 152, and extends downwards, that is, in the direction away from the feeder body 106, perpendicularly to the direction of length of the feeder body 106. The third positioning projection 156 has a part-cylindrical surface in an intermediate portion thereof as seen in its direction of extension. This part-cylindrical surface faces rearwards and has a centerline parallel to the direction of thickness of the tape feeder 20 (feeder body 106). The third positioning projection 156 further has a guide surface in its lower or free end portion. This guide surface is inclined in the forward direction as the guide surface extends downwards.

The first table 22 has a main body formed of an aluminum alloy, and a first and a second feeder positioning 160, 162 fixed on the upper surface of the main body, at the front and rear end portions of the main body, respectively, so as to extend in the direction, as shown in FIGS. 3 and 4. Like the mounting member 150, these first and second feeder positioning plates 160, 162 are formed of a carbon steel material (S50C) suitable for a mechanical structure, and hardened. As shown in FIG. 3, these first and second feeder positioning plates 160, 162 have respective first and second positioning grooves 163, 164 formed so as to extend in the Y-axis direction. The first positioning grooves 163 for the respective tape feeders 20 are arranged at a same spacing pitch as that of the tape feeders 20 in the X-axis direction. The second positioning grooves 164 are similarly arranged in the X-axis direction. Each of the first and second positioning grooves 163, 164 has a width slightly larger than a thickness of the first and second positioning projections 152, 154, and a depth larger than the height of the projections 152, 154, so that the positioning projections 152, 154 of the feeder body 106 are fitted in the respective positioning grooves 163, 164 when the corresponding tape feeder 20 is mounted on the first table 22. The upper surfaces of the first and second feeder positioning plates 160, 162 serve as bearing surfaces for supporting the corresponding feeder 20. The first feeder positioning plate 160 for each tape feeder 20 has throughholes 165 formed through its front end portion, so as to extend in a Z-axis direction perpendicular to the X-axis and Y-axis directions, as shown in FIGS. 3 and 4.

To the upper end portion of the front surface of the main body of the first table 22, there is fixed a stopper plate 166 which is formed of a carbon steel material (S50C) and hardened. This stopper plate 166 has a length almost equal to the dimension of the first table 22 in the X-axis direction, and is positioned relative to the first table 22 such that the upper end portion of the stopper plate 166 is located above the first feeder positioning plate 160. This upper end portion is provided with an extension extending over the front end portion of the mounting member 150. This extension has a second inclined surface which is inclined upwards as this second inclined surface extends rearwards. The angle of inclination of this second inclined surface is equal to that of the first inclined surface formed in the front end portion of the upper surface of the mounting member 150, so that the first inclined surface is brought into contact with the second inclined surface when the corresponding tape feeder 20 is mounted on the first table 22.

In addition to the first and second feeder positioning plates 160, 162, a third feeder positioning plate 168 is fixed to a portion of the rear surface of the main body of the first table 22, which portion is located below the bearing surface indicated above. This third feeder positioning plate 168 is also formed of a carbon steel material (S50C) and hardened. The positioning plate 168 has a plurality of third positioning grooves 170 formed in an upper portion thereof, such that the grooves 170 are arranged at the same spacing pitch as that of the tape feeders 20 in the X-axis direction. Each third positioning groove 170 has a width slightly larger than the thickness or width of the third positioning projection 156. The first, second and third positioning grooves 163, 164, 170 corresponding to the feeder body 106 of each tape feeder 20 cooperate to provide a slot 180 (FIG. 3) for mounting the respective tape feeders 20.

The operator assisting apparatus indicated generally at 200 and constructed according to the present embodiment is arranged to assist the operator of the electronic-component mounting system 12, in performing manual working operations in connection with the tape feeders 20. The operator assisting apparatus 200 consists of two devices which are fixedly disposed on the machine base 50, at respective positions corresponding to the two standby positions of the first and second tables 22, 23 in which the manual working operations are performed by the operator. In FIG. 2, the operator assisting apparatus 200 is not shown for easier showing of the other parts of the system 12. There will be described one of the two devices of the operator assisting apparatus 200, which is provided for the first table 22.

The operator assisting apparatus 200 includes a multiplicity of indicator-detector units 208 corresponding to the tape feeders 20 that can be mounted on the first table 22. In this embodiment, thirty (30) indicator-detector units 208 are arranged in the X-axis direction at the same spacing pitch as that of the tape feeders 20. Each indicator-detector unit 208 includes an indicator device in the form of a pair of irradiating devices 202, 204, and a feeder-mounting detecting device 206 arranged to determine whether the tape feeder 20 is mounted in the corresponding slot 180. When the operator performs the working operations to mount or remove the tape feeders 20 on or from the first table 22, the first table 22 is positioned in the X-axis direction such that the indicator-detector units 208 are aligned with the respective tape feeders 20 or feeder-mounting positions.

Each of the two irradiating devices 202, 204 of each indicator-detector unit 208 includes a light-emitting device in the form of a light-emitting diode (LED) 210 with a lens. A light emitted by the light-emitting diode 210 is condensed by the lens so that the desired surface is irradiated by the emitted light. The first irradiating device 202 is attached to a suitable frame such that the light travels downwards. In the present embodiment, the frame by which the indexing table 32 is supported is used to hold the first irradiating device 202. The first irradiating device 202 includes a housing 212 formed of an opaque material, and a LED substrate 214 fixed on a top wall of the housing 212. The LED 210 extends downwards from the lower surface of the LED substrate 214 such that the light emitted by the LED 210 upon energization thereof travels downwards through the lower open end of the housing 212 of the device 202. The LED 210 and the lower open end of the housing 212 are positioned so as to be opposed to the upper end face of the input bar 126 in the vertical direction when the corresponding tape feeder 20 is placed in position on the first table 22. In other words, the first irradiating device 202 is positioned to irradiate the upper end face of the input bar 126 with a visible light (green light in this embodiment) emitted from the LED 210 located right above the upper end face.

The other or second irradiating device 204 is disposed below the feeder body 106. Since the second irradiating device 204 is similar in construction with the first irradiating device 202, the second irradiating device 204 will be described only briefly. That is, a column 220 is disposed upright on the machine base 50, and the second irradiating device 204 is fixed at the upper end of the column 220 so that a visible light is emitted upwards from the second irradiating device 204. The second irradiating device 204 is positioned right below the corresponding through-hole 165 formed through the first feeder positioning plate 160, so that the generation of the visible light from the second irradiating device 204 can be recognized by the operator, through the through-hole 165, when the operator looks at the upper surface of the first feeder positioning plate 160 in the downward direction while the tape feeder 20 is not mounted in the corresponding slot 180.

The feeder-mounting detecting device 206 of each indicator-detector unit 208 is also attached to the column 220. The feeder-mounting detecting device 206 includes a photoelectric sensor 222 fixed to the upper end portion of the column 220, at a position of the corresponding slot 180, and a communicating device 224 arranged to transmit an output signal of the photoelectric sensor 222 to a control device 300 (which will be described). The photoelectric sensor 222 extends from the column 220 in the Y-axis direction away from the tape feeder 20. As shown in FIG. 3, the photoelectric sensor 222 includes a light emitting body 226 and a light-receiving body 228 which are spaced apart from each other in the Y-axis direction. The light-emitting body 226 is arranged to emit a light (e.g., infrared radiation) upwards. This light is reflected by the lower surface of the feeder body 106 and received by the light-receiving body 228, when the tape feeder 20 is mounted in position. When the tape feeder 20 is not mounted, the light emitted by the light-emitting body 226 is not reflected by the feeder body 106, and is not received by the light-receiving body 228. Thus, a determination as to whether the tape feeder 20 is mounted or not can be effected depending upon the output signal of the light-receiving body 228. Preferably, the light-emitting body 226 is arranged to emit a light whose wavelength is different from that of the light emitted by the LED 210.

On the column 220, there is also disposed a position detecting device 240 arranged to detect a position of the first table 22 relative to the column 220 in the X-axis direction. The position detecting device 240 includes a photoelectric sensor 242, while the first table 22 carries a dog 244. The photoelectric sensor 242 includes a light-emitting body and a light-receiving body which are disposed above and below a path of movement of the dog 244 together with the first table 22. A determination as to whether the first table 22 is located at a predetermined reference position relative to the column 220 (i.e., relative to the operator-assisting apparatus 200) in the X-axis direction can be effected depending upon whether the dog 244 is detected by the photoelectric sensor 242, that is, whether the dog 244 is positioned between the light-emitting and light-receiving bodies. If the first table 22 carries a multiplicity of dogs 244 corresponding to the respective slots 180 (tape feeders 20), the present position of the first table 22 in the X-axis direction could be detected on the basis of a change of the output signal of the light-receiving body of the photoelectric sensor 242. However, only one dog 244 is provided on the first table 22, to detect the predetermined reference position of the first table 22 at which the dog 244 is disposed between the light-emitting and light-receiving position and at which the slots 180 are aligned with the respective indicator-detector units 208 of the operator-assisting apparatus 200.

Figure 5:
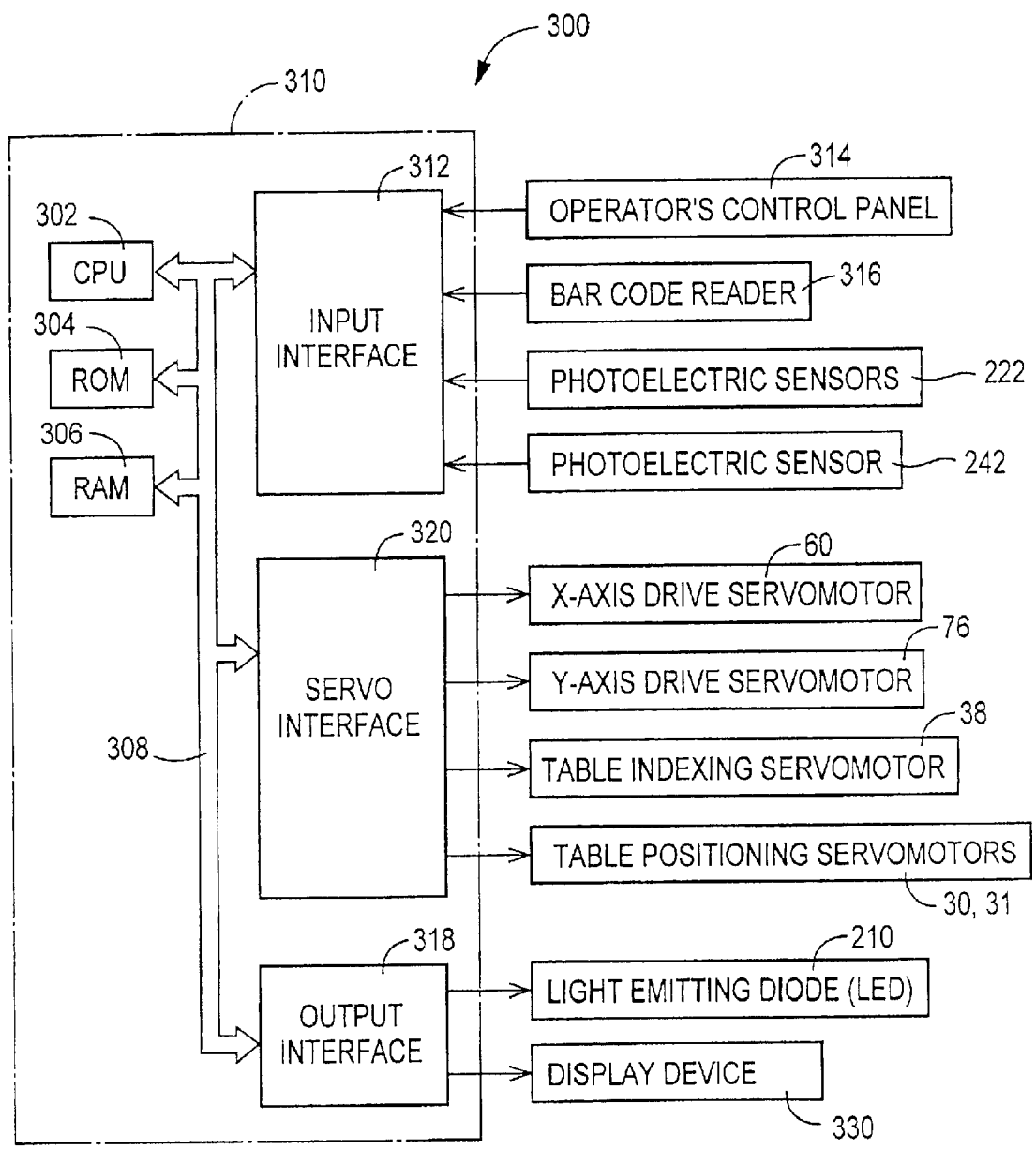
FIG. 5 is a block diagram showing a control device of the electronic-component mounting system.

The present electronic-component mounting system 12 uses the control device 300 as shown in the block diagram of FIG. 5. The control device 300 is principally constituted by a computer 310 incorporating a central processing unit (CPU) 302, a read-only memory (ROM) 304, a random-access memory (RAM) 306 and a bus 308 interconnecting these elements 302, 304 and 306. To the bus 308, there is connected an input interface 312, which is connected to the photoelectric sensors 222, 242 of the operator-assisting apparatus 200, an input device in the form of an operator's control panel 314 and a bar code reader 316. To the bus 308, there are also connected an output interface 318 and a servo interface 320. To the servo interface 320, there are connected the servomotors 30, 31, 38, 60 and 76. To the output interface 318, there are connected the LED 210 and a display device 330 of the operator-assisting apparatus 200. The ROM 304 stores various programs such as those for controlling the electronic-component mounting device 14, and various operator-assisting programs to control the operator-assisting apparatus 200 as illustrated in FIGS. 6 and 7.

There will next be described the manual working operations to be performed by the operator to remove and mount the tape feeders 20 from and on the first and second tables 22, 23, in the electronic-component mounting system 12 constructed as described above. For instance, each of the first and second tables 22, 23 carries an array of tape feeders 20 which accommodates a set of electronic components to be mounted on the printed-wiring board 16 to produce the same printed-circuit board. To repeatedly perform the operations to mount the electronic components successively on a multiplicity of printed-wiring boards 16, the first and second tables 22, 23 are alternately used such that one of these two tables 22, 23 is positioned in the above-indicated common component-supply area of the tables 22, 23, while the other table is located at its standby position. Each of the tape feeders 20 presently mounted on the table 22 or 23 is replaced by the new tape feeder 20, when all of the electronic components accommodated in the presently mounted tape feeder 20 have been used, or when the number of the electronic components left in the presently mounted tape feeder 20 has become smaller than a predetermined lower limit. Where the first and second tables 22, 23 carry respective arrays of tape feeders 20 which accommodate respective sets of electronic components to be mounted on the printed-wiring board 16 to produce respective different printed-circuit boards, a setup changeover of the tape feeders 20 on one of the tables 22, 23 is effected when the number of the printed-circuit boards produced by the electronic components supplied form that table has reached a predetermined value.

Initially, there will, be described the case where all of the electronic components accommodated in the presently mounted tape feeder 20 have been used, or where the number of the electronic components left in the presently mounted tape feeder 20 has been become smaller than the predetermined lower limit. In the present embodiment, the control device 300 is adapted to determine that all of the electronic components in each tape feeder 20 have been used, if the component mounting head 34 have failed to receive an electronic component from that tape feeder 20, for two times consecutively. The control device 300 is further adapted to: store in the RAM 306 of the computer 310 number data indicative of the number of the electronic components accommodated in each tape feeder 20, together with an identification code representative of that tape feeder 20, when a component mounting operation is initiated by the electronic-component mounting device 14, or when the tape feeder 20 is set up on the table 22, 23; count the number of the electronic components that have been supplied from each tape feeder 20; and monitor the number of the electronic components remaining in each tape feeder 20. When the control device 300 detects in a main control routine that all of the electronic components in a given tape feeder 20 have been supplied therefrom or that the number of the electronic components remaining in the tape feeder 20 has become smaller than the lower limit, the control device 300 determines a need of replacing the presently mounted tape feeder 20 with a new one, and provides an indication of this replacement. To indicate the replacement, the control device 300 controls the display device 330 to provide data indicative of the name (identification code) of the presently mounted tape feeder 20 and the new tape feeder 20, and data indicative of the position of the corresponding indicator-detector unit 208 (hereinafter referred to as "relevant indicator-detector unit 208"). Referring to the flow chart of FIG. 6, a feeder replacement assisting program to be executed by the computer 310 will be described.

Figure 6:
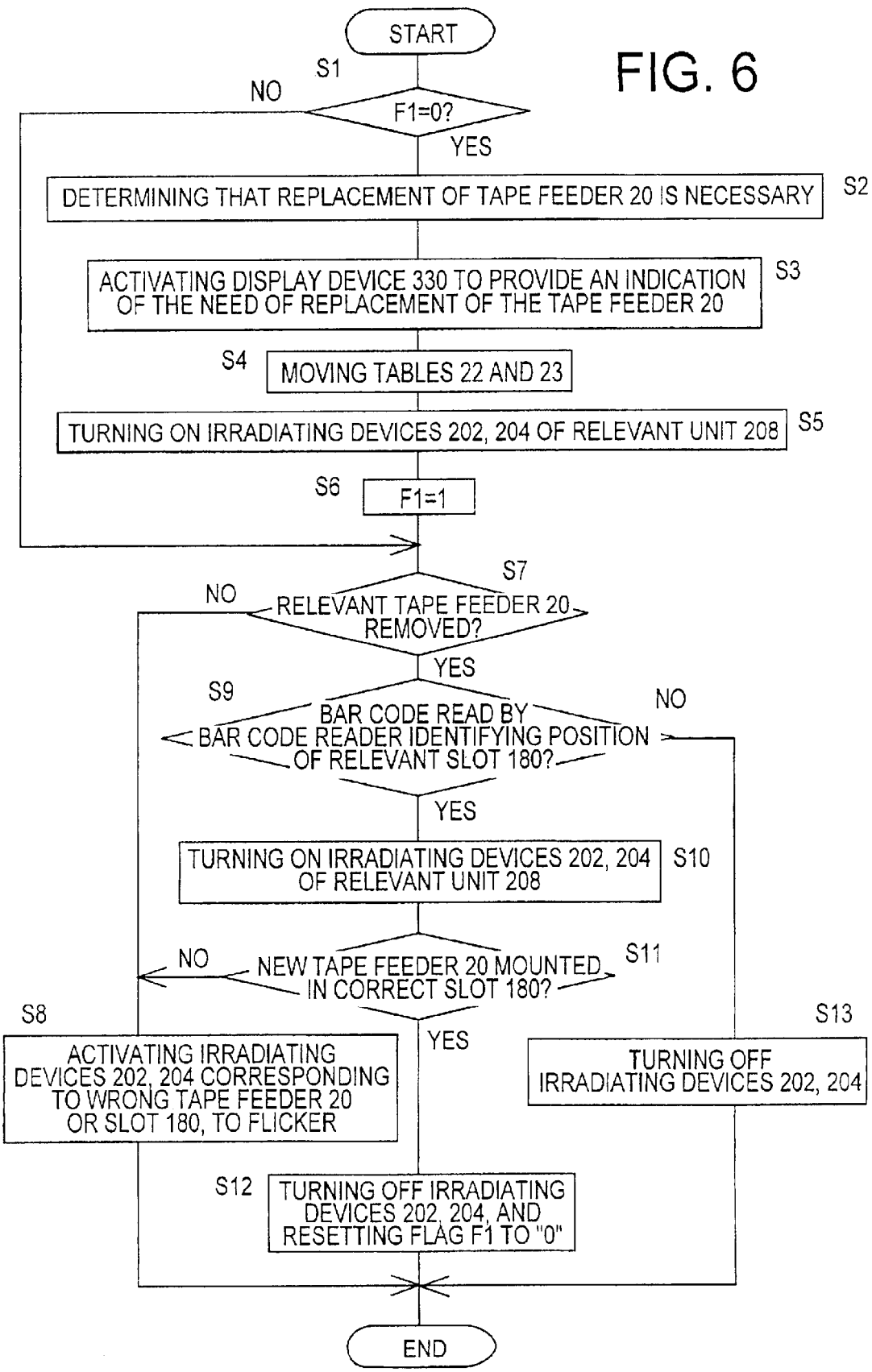
FIG. 6 is a flow chart illustrating a feeder replacement assisting program stored in a computer of the control device of FIG. 5.
Figure 7:
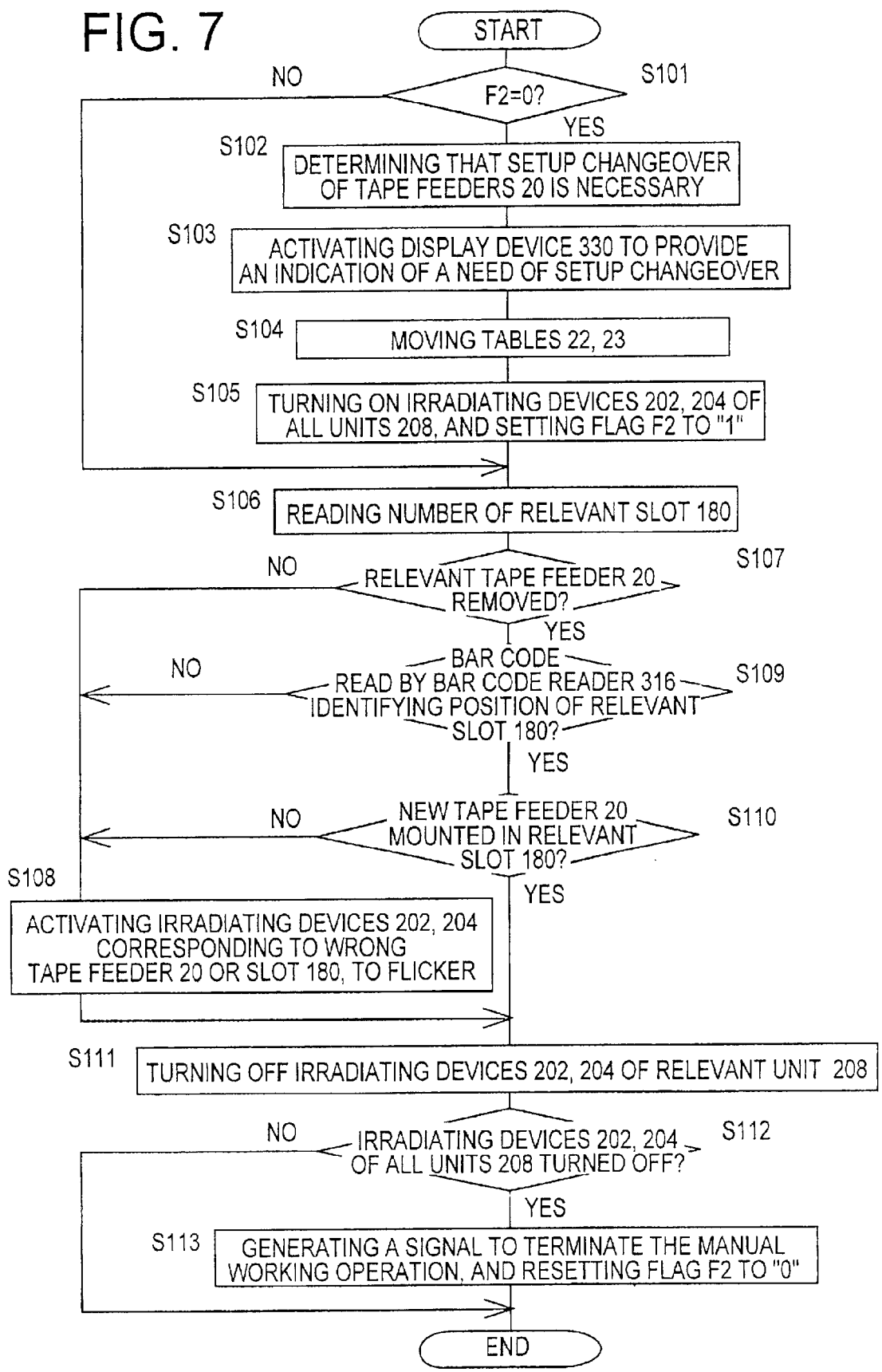
FIG. 7 is a flow chart illustrating a feeder setup changeover assisting program stored in the computer of the control device.

The feeder replacement assisting program of FIG. 6 is executed when the control device 300 has detected in the main control routine that all of the electronic components in a given tape feeder 20 have been used or that the number of the electronic components remaining in the tape feeder 20 has become smaller than the lower limit. The feeder replacement assisting program is initiated with step S1 to determine whether a flag F1 is set at "0". If an affirmative decision (YES) is obtained in step S1, the control flow goes to step S2 to determine that the relevant tape feeder 20 is required to be replaced. Step S2 is followed by step S3 in which the display device 330 provides an indication of a need of replacement of the tape feeder 20 on its display screen. Then, the control flow goes to step S4 to move the relevant table 22, 23, for instance, the first table 22 from the common component-supply area to the standby position, and move the second table 23 into the common component-supply area so that the second table 23 is used for the component mounting operation.

The first table 22 is located at the standby position on the basis of an output signal of the position detecting device 240. In the standby position, step S5 is implemented to turn on the first and second irradiating devices 202, 204 of the relevant indicator-detector unit 208 of the operator assisting apparatus 200, which corresponds to the tape feeder 20 to be replaced, so that the operator is informed of the position of the relevant tape feeder 20. Step S5 is followed by step S6 to set the flag F1 to "1", and step S7 to determine whether the relevant tape feeder 20 has been removed from the first table 22. The operator can find and recognize the relevant the tape feeder 20, since the LED 210 of the relevant indicator-detector unit 208 of the operator assisting apparatus 200 is irradiating the upper end face of the input bar 126 of the relevant tape feeder 20. The operator removes the relevant tape feeder 20 from the first table 22, and mounts the new tape feeder 20 on the first table 22. The removal of the relevant tape feeder 20 causes a change of the output signal of the photoelectric sensor 222 of the relevant indicator-detector unit 208, so that an affirmative decision (YES) is obtained in step S7 to indicate the removal of the relevant tape feeder 20. After the relevant tape feeder 20 has been removed, the operator can observe the visible light emitted from the second irradiating device 204, through the through-hole 165 of the relevant slot 180.

If a tape feeder 20 other than the relevant tape feeder 20 has been removed by error, the output signal of the photoelectric sensor 222 of the indicator-detector unit 208 corresponding to the erroneously removed tape feeder 20 indicates the removal of this wrong tape feeder 20, so that a negative decision (NO) is obtained in step 57 to indicate the removal of the wrong tape feeder 20. In this case, the control flow goes to step S8 to activate the first and second irradiating devices 202, 204 corresponding to the wrong tape feeder 20 such that the irradiating devices 202, 204 flicker to inform the operator that the wrong tape feeder 20 has been removed. In this case, one cycle of execution of the program of FIG. 6 is terminated. In the next cycle in which the flag F1 is set at "1", a negative decision (NO) is obtained in step S1, and the control goes to step S7 while skipping steps S2–56. Steps 51, S7 and S8 are repeatedly implemented until the affirmative decision (YES) is obtained in step 57.

In the present embodiment, the new tape feeders 20 are stored at a suitable storage location outside the present electronic-component mounting system 12. When the new tape feeder 20 is mounted or set up on the first table 22, the operator operates the bar code reader 316 to read a bar code attached to this new tape feeder 20, and then mounts this new tape feeder 20 in the relevant slot 180 on the first table 22. This relevant slot 180 is indicated by the irradiating operations of the first and second irradiating devices 202, 204 of the relevant indicator-detector unit 208, so that the operator can find the relevant slot 180 and can correctly mount the new tape feeder 20 in this relevant slot 180, even where the other slots 180 are empty. When the new tape feeder 20 is mounted on the first table 22, a bar code attached to the carrier tape 100 accommodated in the tape feeder 20, and the bar code on the tape feeder 20 per se are both read by the bar code reader, and stored in the RAM 306 of the control device 300.

Described in detail, the supply reel 104 is set in each tape feeder 20 before the tape feeder 20 is stored at the storage location. At this time, the bar code attached to the tape feeder 20 and the bar code attached to the supply reel 104 are both read by the bar code reader 316 or any other bar code reader, and the output signal of the bar code reader is sent to the control device 300, so that the control device 300 can check whether the bar code representative of the identification number of the new tape feeder 20 to be mounted matches the bar code representative of the identification number of the slot 180 from which the used tape feeder 20 has been removed.

When the affirmative decision (YES) is obtained in step S7, the control flow goes to step S9 to determine whether the bar code read by the bar code reader 316 matches the position of the relevant slot 180 from which the used tape feeder 20 has been removed, that is, whether the identification number of the new tape feeder 20 is the same as that of the removed tape feeder 20. If an affirmative decision (YES) is obtained in step S9, the control flow goes to step S10 to turn on the first and second irradiating devices 202, 204. Step S10 is followed by step S11 to determine whether the new tape feeder 20 has been mounted at the correct position on the first table 22, that is, in the relevant slot 180. This determination is effected on the basis of the output signal of the photoelectric sensor 222 of the relevant unit 208. If an affirmative decision (YES) is obtained in step S11, the control flow goes to step S12 to turn off the first and second irradiating devices 202, 204 to indicate that the used tape feeder 20 has been correctly replaced with the new tape feeder 20, and reset the flag F1 to "0". Thus, one cycle of execution of the program of FIG. 6 is terminated.

If the bar code read by the bar code reader 316 does not identify the position of the relevant slot 180, a negative decision (NO) is obtained in step S9, and the control flow goes to step S13 to turn off the first and second irradiating devices 202, 204 of the relevant indicator-detector unit 208, to inform the operator that the new tape feeder 20 mounted in the relevant slot 180 does not match this slot 180, that is, a wrong tape feeder 20 has been newly mounted. In this case, the operator removes the mounted new tape feeder 20, operates the bar code reader 316 to read the bar code attached to the correct new tape feeder 20,and mounts this correct tape feeder 20 in the relevant slot 180. As a result, the affirmative decision (YES) is obtained in step S9, and the first and second irradiating devices 202, 204 are turned on in step S10, so that the operator can confirm that the correct new tape feeder 20 has been mounted. If the new tape feeder 20 is not mounted in the relevant slot 180, that is, is mounted in the wrong slot 180, this erroneous mounting of the new tape feeder 20 is detected by the photoelectric sensor 222 of the unit 208 corresponding to the wrong slot 180, so that the negative decision (NO) is obtained in step S11. In this case, the control flow goes to step S8 to activate the irradiating devices 202, 204 corresponding to the wrong slot 180, such that the irradiating devices 202, 204 flicker, informing the operator of the erroneous mounting of the new tape feeder 20 in the wrong slot 180. When the operator re-mounts the new tape feeder 20 in the correct slot 180 in which the visible light generated by the second irradiating device 204 is visible through the through-hole 165, the irradiating devices 202, 204 are turned off in step S12, and one cycle of execution of the feeder replacement assisting program is terminated. In this state, the first table 22 is held at the standby position, until the first table 22 is commanded to be moved to the common component-supply area, and operate to supply the electronic components, in place of the second table 23.

The supply reel 104 is removed from the used tape feeder 20 which has been removed from the first table 22, and replaced with the new supply reel 104 accommodating a new roll of the carrier tape 100. Further, the covering tape 102 wound on the take-up reel-124 in the removed tape feeder 20 is removed, and the covering tape 102 of the carrier tape 100 of the new supply reel 104 is connected at its leading end to the take-up reel 124. This tape feeder 20 accommodating the new supply reel 104 is stored, as the new tape feeder 20, at the storage location.

The operator assisting apparatus 200 of the present embodiment is not adapted to assist the operator for simultaneously replacing the two presently mounted tape feeders 20 with the new ones. However, the apparatus 200 may be modified to permit simultaneous replacement of the two tape feeders 20. In this case, the irradiating devices 202, 204 of the indicator-detector units 208 corresponding to the two or more tape feeders 20 that are to be replaced with the new ones are sequentially turned on one after another, so that the operator performs the operations to replace those used tape feeders 20, according to the indication given on the display device 330. In this case, it is desirable to turn off all of the irradiating devices 202, 204 of the relevant units 208 after all of the relevant tape feeders 20 have been correctly replaced with the new ones. However, the arrangement described above is not essential, and may be modified such that the irradiating devices 202, 204 of the units 208 corresponding to all of the two or more tape feeders 20 to be replaced are turned on at the same time. In this case, the operator determines the order of replacement the used tape feeders 20, as desired, manipulates the operator's control panel 314 to specify the identification numbers of the relevant slots 180, and operates the bar code reader 316 to read the bar codes attached to the new tape feeders 20.

There will next be described the case where the number of the printed-circuit boards produced by mounting the electronic components on the printed-wiring boards 16 has reached the predetermined value, so that the setup of the tape feeders 20 on the table 22, 23 is required to be changed to produce printed-circuit boards of another kind. This setup changeover will be described by reference to the flow chart of FIG. 7 illustrating a feeder setup changeover assisting program.

The feeder setup changeover assisting program of FIG. 7 is executed when the control device 300 has detected in the main control routine that the number of the printed-circuit boards produced by using the electronic components supplied from one of the first and second tables 22, 23 has reached the predetermined value. This program is initiated with step S101 to determine whether a flag F2 is set at "0". If an affirmative decision (YES) is obtained in step S101, the control flow goes to step S102 to determine that it is necessary to effect a setup changeover of the tape feeders 20 on the relevant tables 22, 23, for example, on the first table 22. Step S102 is followed by step S103 in which the display device 330 provides an indication of a need of the setup changeover on its display screen. Then, the control flow goes to step S104 to move the relevant table 22, for instance, the first table 22 from the common component-supply area to the standby position, and move the second table 23 into the common component-supply area so that the second table 23 is used for the component mounting operation.

When the setup changeover is effected, the control device 300 controls the indicator-detector units 208 to indicate the tape feeders 20 on the first table 22, which are required to be replaced by other tape feeders 20. Although all of the tape feeders 20 presently mounted on the first table 22 may be removed, the present embodiment is arranged such that the tape feeders 20 not required to be replaced remain on the first table 22. This arrangement is effective to reduce the time required for the setup changeover. In the present embodiment, the control device 300 is adapted to receive from a host computer a control program for producing the next type of printed-circuit boards, together with a parts list indicative of a set of the electronic components to be supplied from the tape feeders 20 mounted in the respective slots 180 of the first table 22. The control device 300 compares this parts list with a parts list indicative of the electronic components accommodated in the tape feeders 20 presently mounted on the first table 22, determine the tape feeders 20 which are required to be replaced to produce the next type of printed-circuit boards, and control the display device 330 to provide an indication of the tape feeders 20 that are required to be replaced.

The first and second irradiating devices 202, 204 of the indicator-detector units 208 corresponding to all of the tape feeders 20 required to be replaced may be sequentially turned on one after another such that the devices 202, 204 corresponding to one of those tape feeders 20 are turned on before the devices 202, 204 corresponding to the next one of those tape feeders 20 are turned on. In the present embodiment, however, the irradiating devices 202, 204 corresponding to all of the tape feeders to be replaced are turned on simultaneously, in step S105, so that the operator determines the order of replacement of the relevant tape feeders 20, as desired. S105 is further formulated to set the flag F2 to "1", so that steps S102-S105 are skipped in the next cycle of execution after the affirmative decision is obtained in step S102. Step S105 is followed by step S106 to read the identification number of the relevant slot 180 from which the presently mounted tape feeder 20 is to be removed for replacement with the other tape feeder 20. This identification number is entered by the operator through the operator's control panel 314. Step S106 is followed by step S107 to determine whether the relevant tape feeder 20 has been removed. This determination in step S107 is effected on the basis of the output signal of the feeder-mounting detecting device 206. When the tape feeder 20 in the relevant slot 180 has been removed, an affirmative decision (YES) is obtained in step S107. In this case, the irradiating devices 202, 204 corresponding to the removed tape feeder 20 are kept on, so that the operator can confirm that the correct tape feeder 20 has been removed (the tape feeder 20 has been removed from the correct slot 180). If the tape feeder 20 has been removed from the wrong slot 180, a negative decision (NO) is obtained in step S107. In this case, the control flow goes to step S108 to activate the first and second irradiating devices 202, 204 corresponding to the tape feeder 20 erroneously removed from the first table 22, such that those irradiating devices 202, 204 flicker, to inform the operator of the erroneous removal of the tape feeder 20. Accordingly, the operator is prompted to remove the tape feeder 20 from the correct slot 180. As a result, the affirmative decision (YES) is obtained in step S107, and the control flow goes to step S109.

After the presently mounted tape feeder 20 has been removed, the operator operates the bar code reader 316 to read the bar code attached to the new tape feeder 20 to be mounted. In step S109, the control device 300 determines whether the bar code read by the bar code reader 316 identifies the identification number of the relevant slot 180 from which the used tape feeder 20 has been removed. If the bar code identifies the identification number of the relevant slot 180, the irradiating devices 202, 204 corresponding to the relevant slot 180 are kept on, so that the operator can confirm that the new tape feeder 20 whose bar code has been read by the bar code reader 316 is the correct tape feeder 20 to be mounted in the relevant slot 180. In this case, an affirmative decision (YES) is obtained in step S109, and the control flow goes to step S110 to determine whether the tape feeder 20 has been mounted in the relevant slot 180. This determination in step S110 is effected on the basis of the output signal of the feeder-mounting detecting device 206. If an affirmative decision (YES) is obtained in step S110, and the control flow goes to step S111 to turn off the irradiating devices 202, 204 corresponding to the new tape feeder 20 mounted in the relevant slot 180. Accordingly, the operator can confirm that the new tape feeder 20 has been mounted in the correct slot 180. If the bar code read by the bar code reader 316 does not identify the identification number of the relevant slot 180, or if the new tape feeder 20 has not been mounted in the relevant slot 180, a negative decision (NO) is obtained in step S109 or step S110. In this case, the control flow goes to step S108 to activate the irradiating devices 202, 204 corresponding to the slot 180 in which the new tape feeder 20 has been erroneously mounted, such that the irradiating devices 202, 204 flicker. Accordingly, the operator can recognize that the mounted new tape feeder 20 does not correspond to the relevant slot 180, or the new tape feeder 20 has been mounted in the wrong slot 180.

If there is still any tape feeder 20 to be replaced, a negative decision (NO) is obtained in step S112, and one cycle of execution of the program of FIG. 7 is terminated. If all of the tape feeders 20 to be replaced have been replaced, an affirmative decision (YES) is obtained in step S112, and the control flow goes to step S113 to generate a signal to terminate the working operation by the operator and reset the flag F2 to "0". In this sate, the first table 22 is held at the standby position, until the first table 22 is commanded to be moved to the common component-supply area, and operate to supply the electronic components, in place of the second table 23.

In the present embodiment, the setup changeover of the tape feeders 20 is effected by replacing the relevant tape feeders 20 one after another, such that the replacement of each relevant tape feeder 20 is effected by first removing the relevant tape feeder 20 from the relevant slot 180 and then mounting the new tape feeder 20 in the relevant slot 180, before removing the next tape feeder 20 to be replaced. However, the present operator assisting apparatus 200 may be modified such that the setup changeover is effected by first removing all of the tape feeders 20 to be replaced, and then mounting the new tape feeders 20 one after another in the respective slots 180. In this case, the mounting of each of the new tape feeders 20 includes a step of entering the identification number of the slot 180 through the operator's control panel 314, reading of the bar code attached to that new tape feeder 20, and mounting the new tape feeder 20 in the relevant slot 180.

Figure 8:
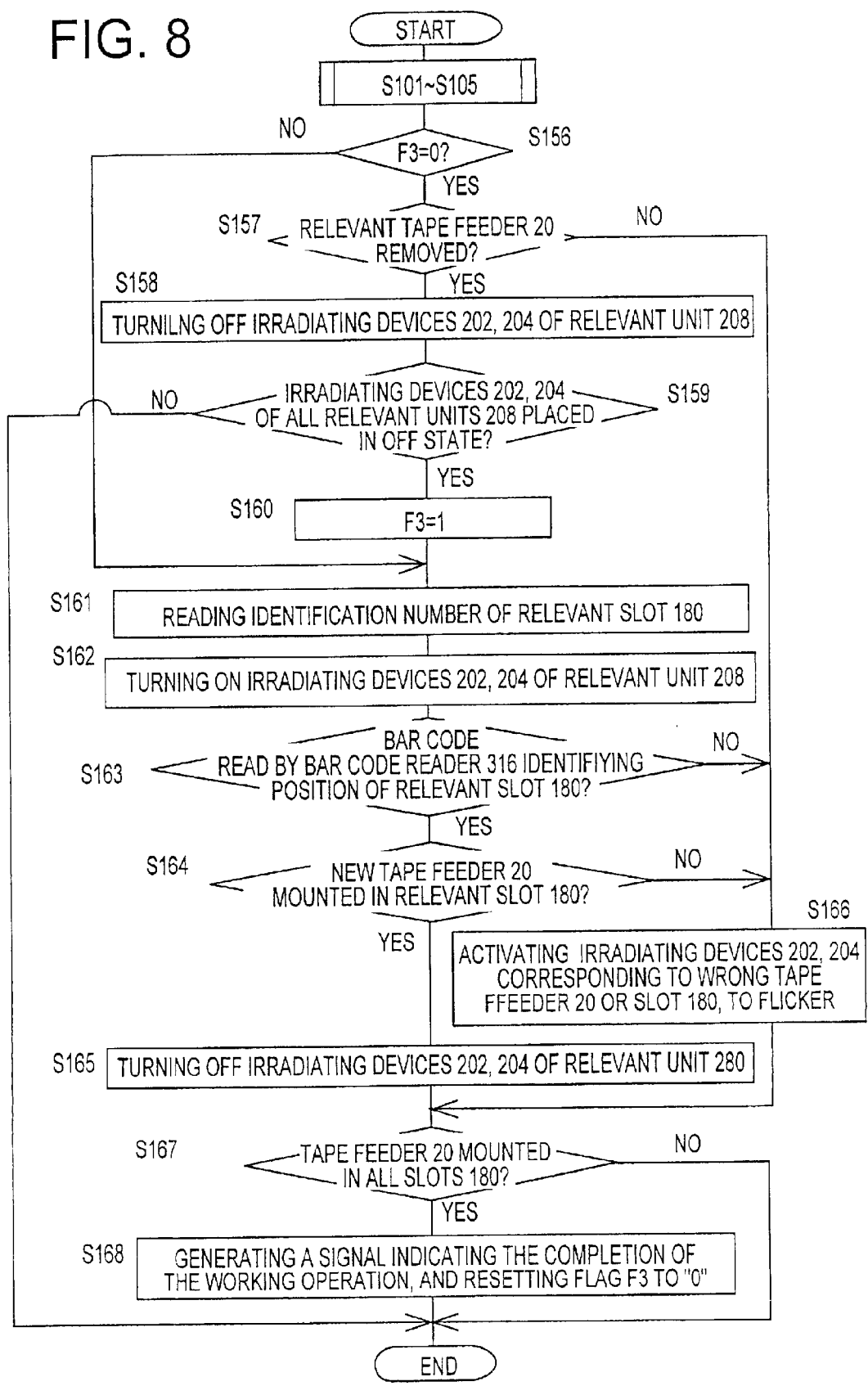
FIG. 8 is a flow chart illustrating another feeder setup changeover assisting program alternative to the program of FIG. 7.

An example of the above-indicated modification is illustrated in the flow chart of FIG. 8. A feeder setup changeover assisting program of FIG. 8 is initiated with steps S101–S105 described above by reference to the flow chart of FIG. 7. Then, steps S156–S160 are implemented to check to see if all of the tape feeders 20 to be replaced have been replaced. Described more specifically, an affirmative decision (YES) is obtained in step S157 if the tape feeder 20 which has been removed is one of the tape feeders 20 to be replaced. In this case, the irradiating devices 202, 204 of the indicator-detector unit 208 corresponding to the slot 180 from which the tape feeder 20 has been removed are turned off. If the removed tape feeder 20 is not any one of the tape feeders 20 to be replaced, a negative decision (NO) is obtained in step S157, and the control flow goes to step S166 to activate the irradiating devices 202, 204 corresponding to the erroneously removed tape feeder 20 such that the irradiating devices 202, 204 flicker. When all of the tape feeders 20 to be replaced have been removed, the irradiating devices 202, 204 of all of the relevant units 208 corresponding to all of those tape feeders 20 to be replaced are in the off state. In this case, an affirmative decision (YES) is obtained in step S159, and the control flow goes to step S160 to set the flag F3 to "1" so that steps S157–S160 will be skipped.

Then, the control flow goes to step S161 to read the identification number of the relevant slot 180 which has been entered by the operator through the operator's control panel 314. Step S161 is followed by step S162 to turn on the irradiating devices 202, 204 corresponding to the relevant slot 180. The operator operates the bar code reader 316 to read the bar code attached to the relevant new tape feeder 20 to be mounted. If the bar code read by the bar code reader 316 identifies the identification number of the relevant slot 180 which has been entered, an affirmative decision (YES) is obtained in step S163, and the control flow goes to step S164 to determine whether the relevant new tape feeder 20 has been mounted in the relevant slot 180. If an affirmative decision (YES) is obtained in steps S163 and S164, the control flow goes to step S165 to turn off the irradiating devices 202, 204 of the indicator-detector unit 208 corresponding to the relevant slot 180. If a negative decision (NO) is obtained in at least one of the steps S163, S164, the control flow goes to step S166 to activate the irradiating devices 202, 204 corresponding to the slot 180 in which the new tape feeder 20 has been erroneously mounted, such that the irradiating devices 202, 204 flicker.

Steps S165 and S166 are followed by step S167 to determine whether all of the relevant new tape feeders 20 have been mounted in the relevant slots 180, respectively. If any of the new tape feeders 20 to be mounted has not been mounted in the corresponding slot 180, a negative decision (NO) is obtained in step S167, one cycle of execution of the program of FIG. 8 is terminated. If all of the relevant new tape feeders 20 have been mounted in the respective slots 180, the control flow goes to step S168 to generate a signal indicating that the working operation for changing the setup of the tape feeders 20 has been completed, and reset the flag F3 to "0". Thus, the setup changeover of the first table 22 is terminated. In this state, the first table 22 is kept at the standby position until the first table 22 is commanded to be moved into the common component-supply area, and operate to supply the electronic components, in place of the second table 23.

It will be understood from the foregoing description of the present embodiment that the first and second irradiating devices 202, 204 constitute a feeder indicator, and that the second irradiating device 204 constitutes a position indicator. It will also be understood that a portion of the control device 300 assigned to implement steps S8, S11 and S12 of FIG. 6, steps S108, S110 and S111 of FIG. 7 and steps S164–S166 of FIG. 8 constitutes a mounting-position checking and indicating device, while a portion of the control device 300 assigned to implement steps S7 and S8 of FIG. 6, steps S107 and S108 of FIG. 7 and steps S157, S158 and S166 of FIG. 8 constitutes a removing-position checking and indicating device.

In the first embodiment described above, each tape feeder 20 presently mounted on the table 22, 23 is replaced with a new one in either one of the two cases: when all of the electronic components accommodated in that tape feeder 20 have been used; and when the number of the electronic components left in the tape feeder 20 has become smaller than a predetermined lower limit. However, the replacement may be effected in only one of those two cases. Further, when a need to immediately replace any tape feeder 20 is detected, any other tape feeders which are expected to be replaced in the near future may be replaced together with the tape feeder that is required to be immediately replaced. For instance, when a tape feeder whose number of electronic components has become smaller than a predetermined first value (predetermined lower limit) is replaced, any tape feeders whose numbers of electronic components have become smaller than a predetermined second value larger than the first value may be replaced together with the tape feeder whose number of electronic components has become smaller than the first value. In this case, the carrier tape 100 of the tape feeder whose number of electronic components has become smaller than the first value may be discarded, since the first value is comparatively small, but the tape carriers 100 of the other tape feeders whose numbers of electronic components have become smaller than the second value are desirably utilized for the production of a printed-circuit board of a relatively small lot size, or connected by splicing to a new carrier tape 100 to make a longer carrier tape. In the present arrangement, a relatively large number of tape feeders 20 are replaced at one time, making it possible to reduce the required number of movements of the first table 22 between the common component-supply area and the standby position, for thereby improving the efficiency of the working operations performed by the operator.

In the first embodiment described above, the visible lights emitted by the LEDs 210 of the first and second irradiating devices 202, 204 have the same color, these visible lights may be respective different colors. Alternatively, each of the irradiating devices 202, 204 may have two LEDs operable to emit visible lights of respective two different colors. In the latter case, it is possible, for example, to use one of the two LEDs for indicating the tape feeder 20 to be replaced, and the other LED for informing the operator of an erroneous working operation, for instance, the mounting of a new tape feeder 20 in the wrong slot 180.

Figure 9:
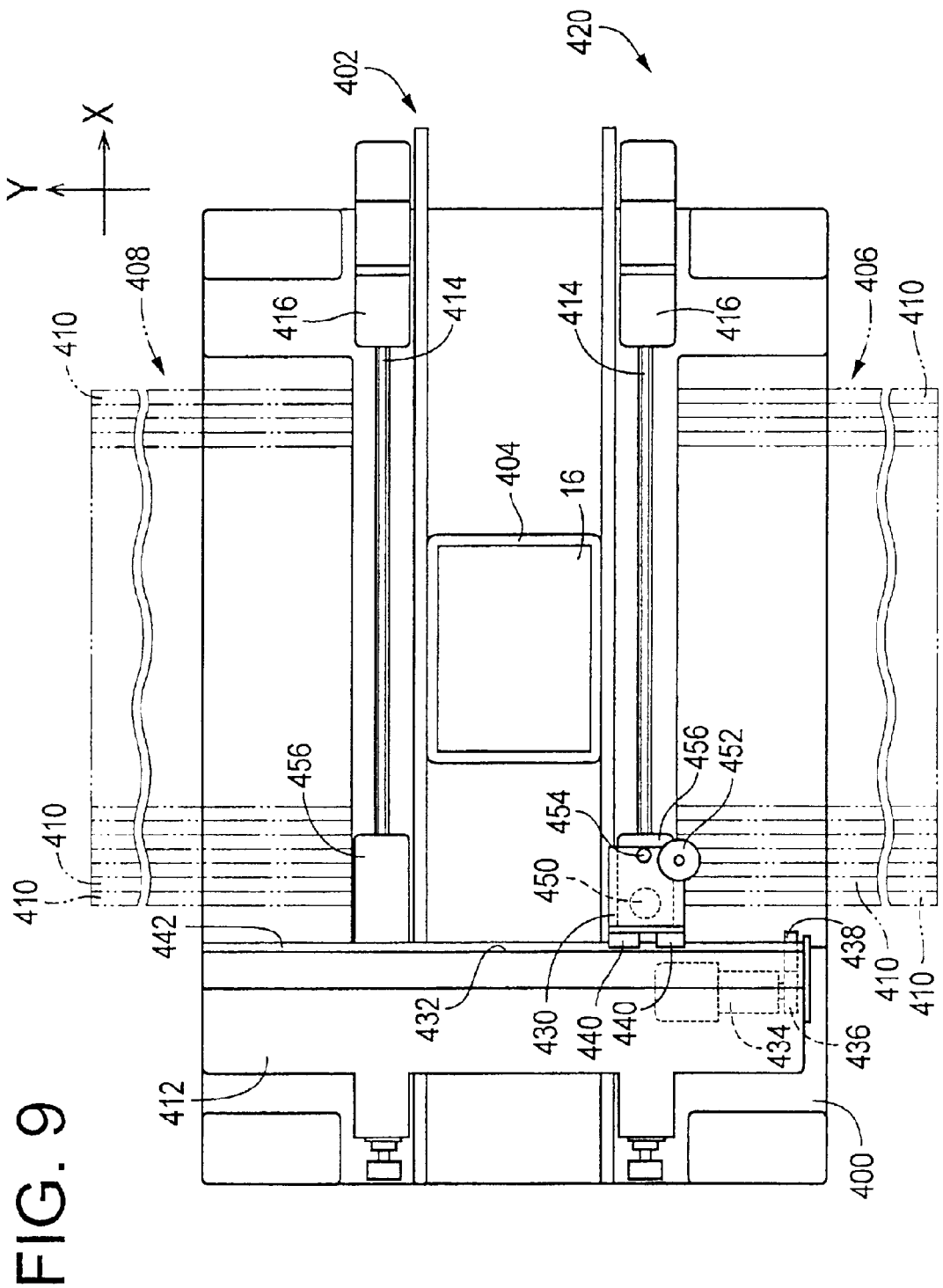
FIG. 9 is a plan view of an electronic-component mounting system incorporating an operator assisting apparatus according to another embodiment of this invention.

Referring next to FIG. 9, there is shown an electronic-component mounting system incorporating an operator assisting apparatus according to another embodiment of this invention. This electronic-component mounting system is constructed as disclosed in EP 1041870A3, and will be described only briefly. The present system has a machine base 400, on which there is disposed a printed-wiring-board conveyor 402 serving as a board transferring device operable to transfer the printed-wiring board 16 in the X-axis direction (in the left and right direction as seen in FIG. 9). The printed-wiring board 16 is transferred by the conveyor 402, and positioned by a printed-wiring-board supporting device 404 at a predetermined position such that the board 16 has a horizontal attitude.

On the machine base 400, there are also disposed two stationary electronic-component supply devices 406, 408 both of which are component-supply devices of feeder type. These two electronic-component supply devices 406, 408 are disposed on respective opposite sides of the printed-wiring-board conveyor 402 such that the two devices 406, 408 are spaced apart from each other in a Y-axis direction perpendicular to the X-axis direction. Each of these electronic-component supply devices 406, 408 has a multiplicity of tape feeders 410, which are disposed such that their component-supply portions are arranged along a straight line parallel to the X-axis direction.

In the present second embodiment of FIG. 9, the two electronic-component supply devices 406, 408 are used to supply respective sets of electronic components of the same kinds, so that the electronic components necessary to produce printed-circuit boards of the same type may be supplied by a selected one of the two devices 406, 408. In this arrangement, when one of the two devices 406, 408 becomes inoperable to supply the electronic components, the other device 406, 408 may be operated to supply the necessary electronic components, without an interruption of a component supplying operation in the system.

On the machine base 400, there is also disposed an electronic-component mounting device including a component mounting head 450 which will be described. The electronic components supplied by the electronic-component supply devices 406, 408 are mounted by the component mounting head 450, on the printed-wiring board 16 to produce a printed-circuit board. On the machine base 400, there are disposed two guide rails and two guide blocks (not shown) on the opposite sides of the printed-wiring-board conveyor 402, such that the guide rails and blocks extend in the X-axis direction, so as to slidably support an X-axis slide 412. As shown in FIG. 9, the X-axis slide 412 has a length enough to extend to the two electronic-component supply devices 406, 408, across the printed-wiring-board conveyor 402. The X-axis slide 412 has two ballnuts (not shown) fixed thereto and held in engagement with respective ballscrews 414. The X-axis slide 412 is moved in the X-axis direction in a horizontal XY plane, when the ballscrews 414 are rotated by respective two X-axis drive servomotors 416 operated in synchronization with each other. The ballnuts, ballscrews 414 and X-axis drive servomotors 416 cooperate to constitute an X-axis drive device 420, while the above guide rails and blocks constitute a guiding device for guiding the movement of the X-axis slide 412.

On the X-axis slide 412, there is disposed a Y-axis slide 430 such that the Y-axis slide 430 is movable in the Y-axis direction perpendicular to the X-axis direction, in the XY plane. The X-axis slide 412 has a vertically extending side surface 432 on which there is fixedly disposed a ballscrew (not shown) extending in the Y-axis direction. The Y-axis slide 412 has a ballnut (not shown) fixed thereto and held in engagement with the ballscrew. The ballscrew is connected to a Y-axis drive servomotor 434 through gears 436, 438. With the ballscrew rotated by the servomotor 434, the Y-axis slide 412 is moved in the Y-axis direction while being guided by a pair of guide blocks 440 and a pair of guide rails 442. It will be understood that the ballscrew, ballnut and Y-axis drive servomotor 434 cooperate to constitute a Y-axis drive device, while the guide blocks 440 and guide rails 442 constitute a guiding device for guiding the movement of the Y-axis slide 430.

The Y-axis slide 430 consists of a plurality of members assembled together, for easier manufacture. In the present embodiment, the X-axis slide 412 is movable in the X-axis direction in the XY plane parallel to the horizontal surface of the printed-wiring board 16 supported by the printed-wiring-board supporting device 404, and the Y-axis slide 430 is movable in the Y-axis direction perpendicular to the X-axis direction, in the XY plane, so that the Y-axis slide 430 is movable to a desired position in the horizontal XY plane.

The Y-axis slide 430 carries the above-indicated component mounting head 450, and two image-taking devices in the form of a CCD camera 452 operable to take an image of the printed-wiring board 16 and a CCD camera 454 operable to take an image of the electronic component. The CCD camera 454 is disposed on an end portion of the Y-axis slide 430 extending in the X-axis direction, such that the GCD camera 454 is aligned with the component mounting head 450 in the Y-axis direction and faces downwards. The component mounting head 450 has a suction nozzle, which is movable to a desired position in the horizontal XY plane when the Y-axis slide 430 is moved to the corresponding position.

The X-axis slide 412 carries two reflecting devices 456 fixed thereto such that the two reflecting devices 456 are located above the respective ballscrews 414. When the Y-axis slide 430 is moved on the X-axis slide 412 in the Y-axis direction, the component mounting head 450 and the CGD camera 454 are moved past points right above the reflecting devices 456. The two reflecting devices 456 have respective light reflecting surfaces which are inclined in opposite directions by 45° with respect to the XY plane, so that the CCD camera 454 can take an image of the electronic component held by the component mounting head 450 when the head 450 is located right above one of the two reflecting devices 456.

The arrangement of each tape feeder 410 will be described briefly since the tape feeders 410 per se do not directly relate to the present invention. The same reference numerals as used in the first embodiment will be used to identify similar elements, which will not be described. The following description refers to only a portion of the tape feeder 410 which is different from the corresponding portion of the tape feeder 20.

Figure 10:
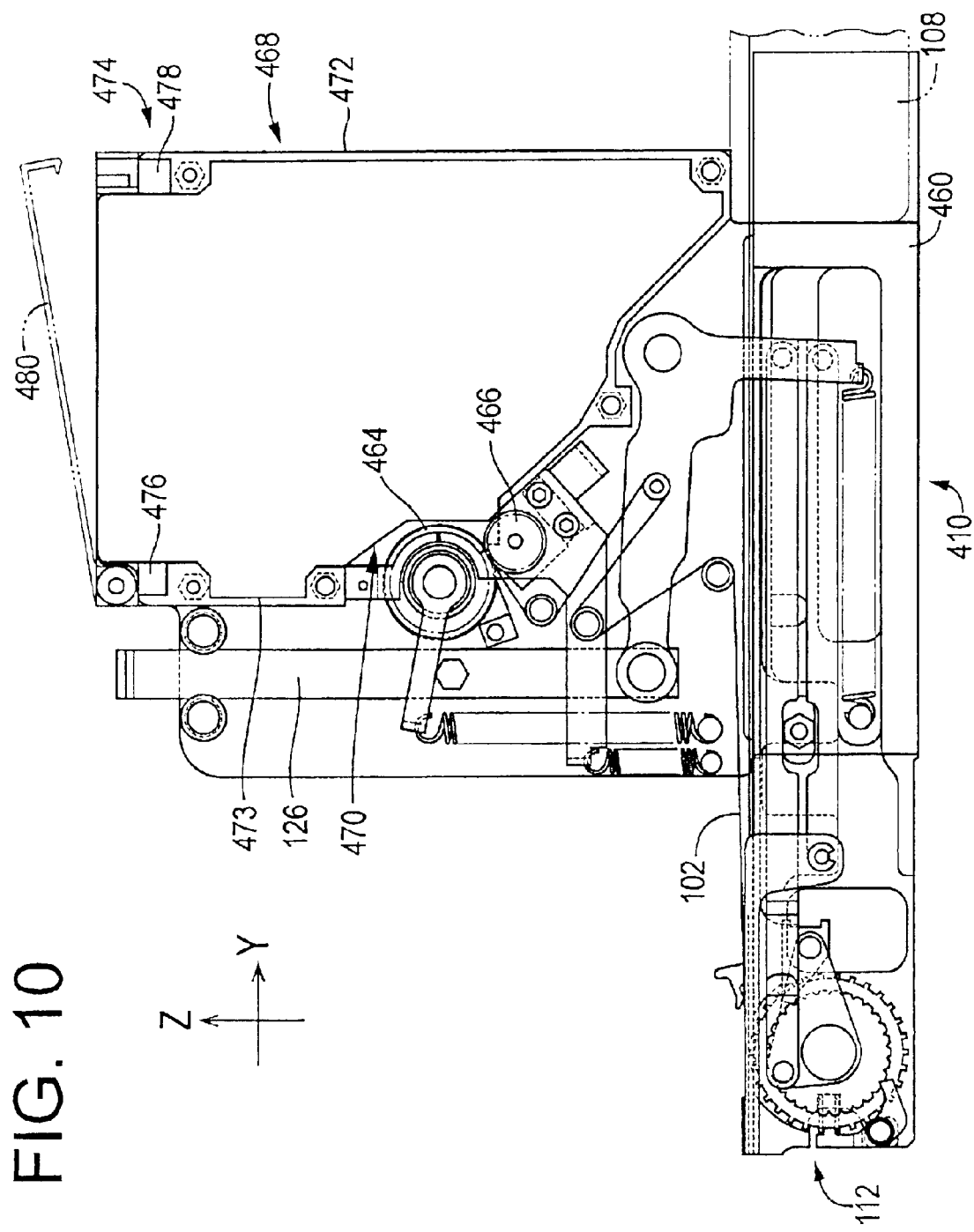
FIG. 10 is a fragmentary side elevational view showing a part of a feeder in the electronic-component mounting system of FIG. 9.

As shown in FIG. 10, each tape feeder 410 has a feeder body 460, and includes the feeding device 112 arranged to intermittently feed the carrier tape 100 by a predetermined incremental distance, while the covering tape 102 is separated from the carrier tape 100. The feeding device 112 of each tape feeder 410 is driven by a drive source (not shown) fixedly provided at a position on the machine base 400, which position corresponds to the position of the tape feeder 410. In the present second embodiment, the tape feeder 410 is provided with covering-tape accommodating means in the form of a storage container 468 which has a pair of feed rollers 464, 466. The storage container 468 has an opening 470 through which the covering tape 102 separated from the carrier tape 100 is fed into the interior of the storage container 468. The feed rollers 464, 466 are disposed adjacent the opening 470, so as to define a nip therebetween, so that the covering tape 102 is fed through the nip into the storage container 468 when the feed rollers 464, 466 are rotated.

The storage container 468 is formed of a transparent plastic material, so that the volume of the covering tape 102 accommodated in the storage container 468 can be detected by visual inspection by the operator. The storage container 468 has a pair of side walls 472, 473 opposed to and spaced from each other in the Y-axis direction. These side-walls 472, 473 have a light-receiving body 478 and a light-emitting body 476, respectively, fixed thereto at their upper end portions. The light-receiving and light-emitting bodies 478, 476 cooperate to constitute a photoelectric sensor which serves as a covering-tape storage volume sensor 474 for detecting the volume of the covering tape 102 accommodated in the storage container 468. A light emitted by the light-emitting body 476 is received by the light-receiving body 478 unless the covering tape 102 within the storage container 468 prevents the light from being incident upon the light-receiving body 478. Described in detail, the entirety of the light emitted from the light-emitting body 476 is incident upon the light-receiving body 478 when the covering tape 102 does not exist above a level higher than a straight line connecting the light-emitting and light-receiving bodies 476, 478. This level corresponds to an upper limit of the volume of the covering tape 102 accommodated in the storage container 468. As the level of the covering tape 102 is raised toward and above the above-indicated straight line, the amount of the light received by the light-receiving body 478 is reduced and eventually zeroed, depending upon how much the transmission of the light between the light-emitting and light-receiving bodies 476, 478 is disturbed by the covering tape 102. Accordingly, a determination as to whether the volume of the covering tape 102 accommodated within the storage container 468 is larger than the predetermined upper limit can be made depending upon whether the amount of the light received by the light-receiving body 478 is larger than a predetermined threshold.

The storage container 468 has an upper open end, and is provided with a lid 480 which is movable between a closed position for closing the opening at the upper end, and an open position for holding the opening in its open state when the covering tape 102 is removed from the storage container 468.

Figure 11:
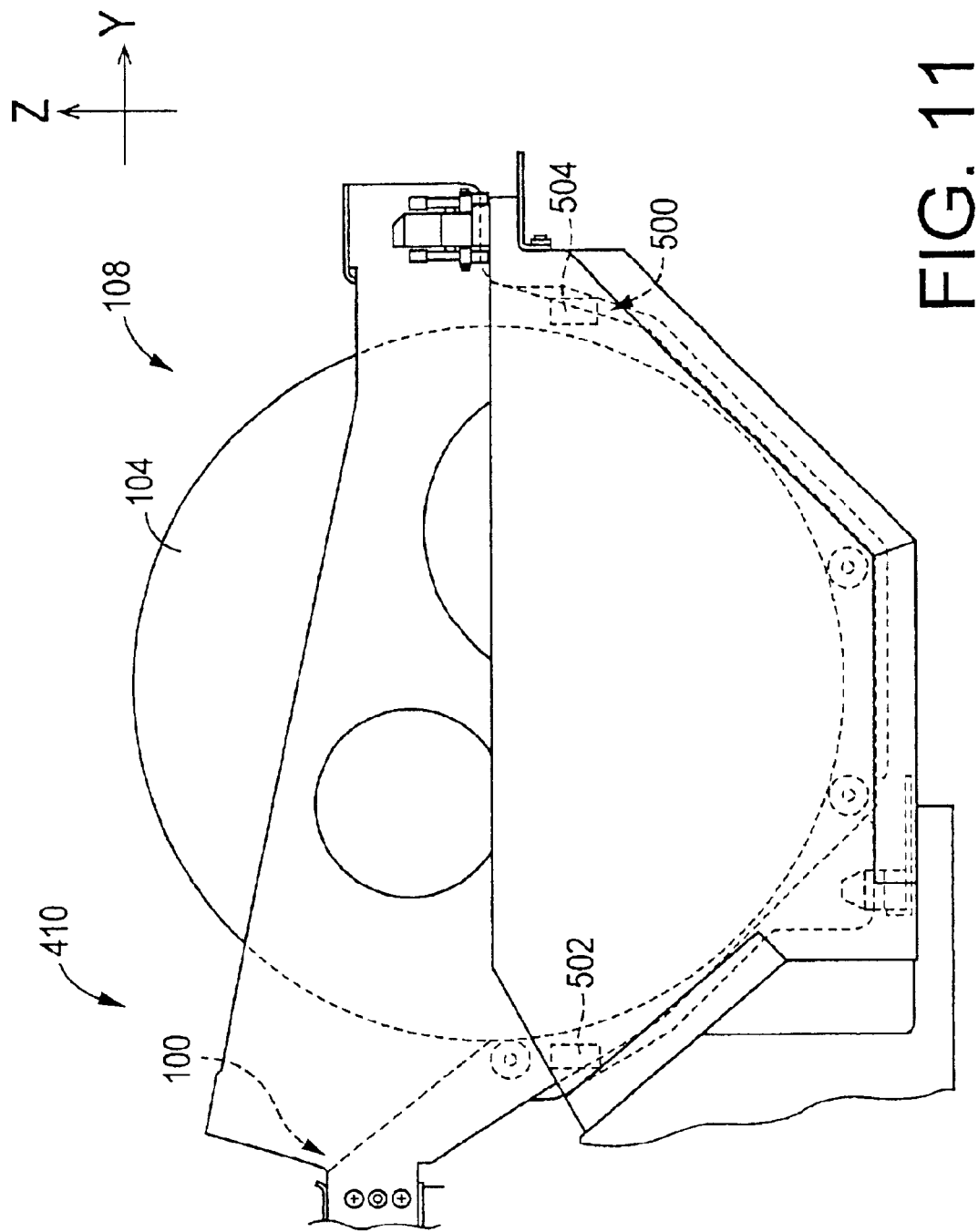
FIG. 11 is a side elevational view showing another part of the feeder of FIG. 10.

In the present electronic-component mounting system, the reel support 108 of the tape feeder 410 is provided with a reel-mounting sensor 500 operable to detect that the supply reel 104 is mounted on the reel support 108, as shown in FIG. 11 which shows only the reel support 108 in enlargement. The reel-mounting sensor 500 is a photoelectric sensor including a light-emitting body 502 and a light-receiving body 504 which are spaced apart and opposed to each other in the Y-axis direction such that a straight line connecting these bodies 502, 504 lies within the interior of the reel support 108, so that the light emitted from the light-emitting body 502 reaches the light-receiving body 504 along this straight line unless the transmission of the light is disturbed by the roll of the carrier tape 100 wound on the supply reel 104. Described more specifically, the light emitted from the light-emitting body 502 does not reach the light-receiving body 504 when the diameter of the roll of the carrier tape 100 is larger than a predetermined lower limit, with a sufficiently large number of electronic components carried by the roll. When the diameter of the roll of the carrier tape 100 becomes smaller than the lower limit, with a decrease of the number of the electronic components carried by the roll, or when the supply reel 104 is removed from the reel support 108, the light is received by the light-receiving body 504, in the absence of the roll of the carrier tape 100 adjacent to the straight line connecting the light-emitting and light-receiving bodies 502, 504. Thus, the reel sensor 500 is arranged to detect the mounting of the supply reel 104 when the diameter of the roll of the carrier tape 100 wound on the supply reel 104 is larger than the lower limit, and the absence or removal of the supply reel 104 when the supply reel 104 has been removed as a result of a decrease of the diameter of the roll of the carrier tape 100 below the predetermined lower limit. The reel-mounting sensor 500 detects the mounting of a new supply reel 104 with the roll of the carrier tape 100 having a diameter larger than the lower limit. Accordingly, the replacement of the supply reel 104 with a new one can be detected by the control device 300, on the basis of generation of an output signal of the sensor 500 indicative of the removal of the presently mounted supply reel 104 and a subsequent change of the output signal upon mounting of the new supply reel 104.

The operator assisting apparatus 200 is fixedly provided for each of the two electronic-component supply devices 406, 408, for assisting the operator of the system in performing manual working operations in connection with the tape feeders 410. Each operator assisting apparatus 200 in the present second embodiment is substantially identical with that in the first embodiment. In the present second embodiment, each apparatus 200 is disposed so as to prevent an interference with the component mounting head 450 and the drive source of the feeding device 112 of each tape feeder 410.

There will be described some manual working operations to be performed by the operator in connection with the tape feeders 410 in the present electronic-component mounting system. Initially, there will be described intermediate working operations which does not involve the replacement of the tape feeders 410. The intermediate working operations include an operation to remove the length of the covering tape 102 which is accommodated within the storage container 468, and a splicing operation to splice the new carrier tape 100 to the presently used carrier tape 100 placed on the appropriate tape feeder 410, at their leading and trailing ends, when the number of the electronic components carried by the presently used carrier tape 100 has become smaller than a predetermined lower limit. The splicing operation produces a continuous new carrier tape 100, as disclosed in U.S. Pat. No. 6,073,334.

The removal of the covering tape 102 out of the storage container 468 is effected by the operator when the operator is informed by the covering-tape storage volume sensor 474 provided on the storage container 468 that the volume of the covering tape 102 accommodated within the storage container 468 has reached the predetermined upper limit. This operation will be described by reference to the flow chart of FIG. 12 illustrating a covering-tape removal assisting program.

Figure 12:
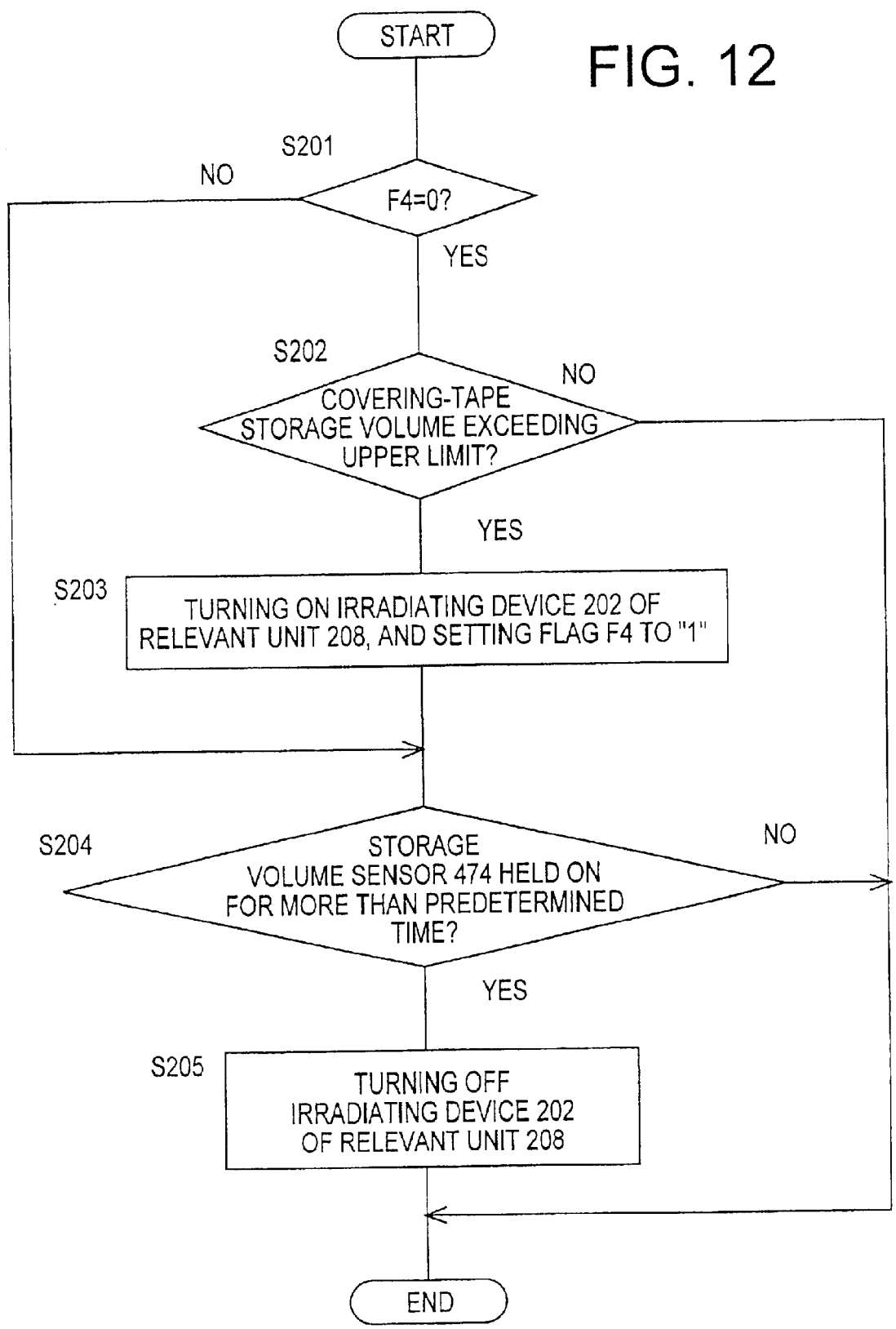
FIG. 12 is a flow chart illustrating a covering-tape removal assisting program stored in the computer of the control device of the electronic-component mounting system of FIG. 9.

The covering-tape removal assisting program of FIG. 12, which is executed for each of the tape feeders 410, is with step S201 to determine whether a flag F4 is set at "0". If an affirmative decision (YES) is obtained in step S201, the control flow goes to step S202 to determine whether the output signal of the covering-tape storage volume sensor 474 indicates that the volume of the covering tape 102 accommodated in the storage container 468 has exceeded the predetermined upper limit. If an affirmative decision (YES) is obtained in step S202, the control flow goes to step S203 to turn on the first irradiating device 202 of the indicator-detector unit 208 corresponding to the tape feeder 410 in which the volume of the covering tape 102 in the storage container 468 has exceeded the upper limit. As a result, a selected portion of the relevant tape feeder 410 (for instance, the lid 480 of the storage container 468) is irradiated with the visible light emitted by the first irradiating device 202. Step S203 is further formulated to set the flag F4 to "1", so that steps S202 and S203 are subsequently skipped. Accordingly, the operator can recognize the tape feeder 410 which is irradiated with the visible light emitted by the irradiating device 202, and open the lid 480 of the storage container 468. The operator removes a suitable length of the covering tape 102 from the storage container 468, and cut off the covering tape 102 so that a suitable length of the covering tape 102 remains in the storage container 468. Although the second irradiating device 204 located below the first irradiating device 202 may be turned on simultaneously with the first irradiating device 202, this device 204 is not turned on in this embodiment, since the light emitted from the device 204 is not visible when the tape feeder 410 remains mounted on the support structure.

Step S203 is followed by step S204 to determine whether the covering-tape storage volume sensor 474 is held in the on state for more than a predetermined time, with the light-receiving body 478 continuously receiving the light emitted from the light-emitting body 476. After the covering tape 102 has been removed from the storage container 468, the level of the covering tape 102 accommodated in the storage container 468 is lowered from the upper limit level, and an affirmative decision (YES) is obtained in step S204. As a result, the control flow goes to step S205 to turn off the first irradiating device 202 and reset the flag F4 to "0", so that the operator is informed that the removal of the covering tape 102 has been effected correctly.

The upper limit of the storage volume of the covering tape 102 in the storage container 468 may be set to be comparatively small. In this case, a comparatively large length of the covering tape 102 can be still accommodated in the storage container 468 even after the covering-tape storage volume sensor 474 has detected that the storage volume has exceeded the upper limit. In this case, therefore, the covering tape 102 need not be removed from the storage container 468 immediately after the detection that the storage volume has exceeded the upper limit, and may therefore be removed only when a predetermined condition is subsequently satisfied. For example, the coveting covering tape 102 is removed when a predetermined time has passed after the detection that the storage volume has exceeded the upper limit, and/or when the number of the tape feeders 410 in which the storage volume of the covering tape 102 has exceeded the upper limit has become larger than a predetermined upper limit.

There will next be described the splicing operation by reference to the flow chart of FIG. 12 illustrating a splicing assisting program. This program is also executed for each of the tape feeders 410 of the electronic-component supply device 406, 408 which is presently used to supply the electronic components. In this example, the electronic-component supply device 406 is used. The splicing assisting program is initiated with step S301 to determine whether a flag F5 is set at "0". If an affirmative decision (YES) is obtained in step S301, the control flow goes to step S302 to determine whether the number of the electronic components accommodated in the carrier tape 100 has become smaller than a predetermined lower limit (whether all of the electronic components have been used). This determination in step S302 is effected on the basis of the output signal of the reel-mounting sensor 500. If an affirmative decision (YES) is obtained in step S302, the control flow goes to step S303 to determine that it is necessary to effect the splicing operation of the carrier tapes 100, and then to step S304 to turn on the first irradiating device 202 of the indicator-detector unit 208 corresponding to the relevant feeder 410, and set the flag F5 to "1". As a result, a portion of the relevant tape feeder 410 is irradiated with the visible light emitted by the irradiating device 202. In this case, the other electronic-component supply device 408 is used to supply the component mounting head 450 with the electronic components. In the present electronic-component mounting system wherein the electronic components are supplied by one of the two electronic-component supply devices 406, 408, the determination in step S308 of effecting the splicing operation in connection with any one of the tape feeders 410 of the presently used device 406 causes the other device 408 to be moved into the common component-supply area for supplying the component mounting head 450 with the electronic components, while moving the presently used device 406 to the standby position. Accordingly, the operator may perform the splicing operation on the relevant tape feeder 410.

In the present embodiment, the same irradiating device 202 is turned on to indicate the relevant tape feeder 410, when the covering tape 102 is required to be removed from the storage container 468, and when the splicing of the carrier tape 100 is required. Therefore, the operator who is thus informed of a need of performing some intermediate working operation is required to observe the storage volume of the covering tape 102 within the storage container 468 of the relevant tape feeder 410, and the diameter of the roll of the carrier tape 100 on the supply reel 104 of the relevant tape feeder 410, in order to determine whether the removal of the covering tape 102 or the splicing of the carrier tapes 100 is needed. Depending upon a result of the observation, the operator performs the removal of the covering tape 102 or the splicing of the carrier tapes 100. In most cases, the operator easily recognizes the intermediate working operation (removal of the covering tape 102 or the splicing operation) required to be performed. In some cases, however, the operator feels difficulty in correctly recognizing the required intermediate working operation. In the latter cases, the operator may perform one of the two intermediate working operations whichever is considered to be more appropriate. If the irradiating device 202 is turned off as a result of the performed intermediate working operation, this is an indication that the performed operation was in fact needed. However, the need of removing the covering tape 102 and the need of effecting the splicing operation of the carrier tapes 100 may be indicated by respective visible lights of different colors emitted by the irradiating device 202, or by operations of the irradiating device 202 in respective different modes, so that the operator may easily recognize which one of the two different intermediate working operations is actually needed.

Where the splicing operation is performed by the operator in response to the activation of the irradiating device 202, the output signal of the reel-mounting sensor 500 indicates that the supply reel 104 of the relevant tape feeder 410 is absent. After the splicing operation is completed, the output signal of the sensor 500 changes to a state indicating that the supply reel 104 is present. To determine whether the slicing operation has been completed, step S304 is followed by step S305 to determine whether the operating state of the reel-mounting sensor 500 has changed from the ON state to the OFF state, to indicate the completion of the splicing operation. If an affirmative decision (YES) is obtained in step S305, the control flow goes to step S306 to turn off the irradiating device 202 and reset the flag F5 to "0".

Step S305 may be replaced by a step to determine whether the control device 300 has received a signal indicative of the completion of the splicing operation, which signal is generated from the operator's control panel 314 upon operation of this control panel 314 by the operator after the splicing operation.

The electronic components accommodated in trailing end portion of the presently used carrier tape 100 are not discarded but are eventually utilized after the splicing to the new carrier tape 100, the above-indicated lower limit of the diameter of the roll of the presently used carrier tape 100 may be set to be comparatively large. In this case, a comparatively large number of electronic components are still accommodated in the carrier tape 100 when the diameter of the roll has become smaller than the lower limit. In this case, therefore, the presently used carrier tape 100 need not be spliced to the new carrier tape 100 immediately after the detection that the diameter of the roll has become smaller than the lower limit, and may therefore be spliced to the new carrier tape 100 only after a predetermined condition is subsequently satisfied. For example, the splicing operation is performed when a predetermined time has passed after the detection that the diameter of the roll has become smaller than the lower limit, and/or when the number of the tape feeders 410 in which the number of the remaining electronic components has become smaller than a predetermined lower limit has became larger than a predetermined upper limit. It is also possible to move the presently used electronic-component supply device 406, 408 to the standby position, and move the other supply device 406, 408 to the common component-supply area, when all of the electronic components in any one of the tape feeders 410 of the presently used supply device 406, 408 have been used. In this case, the splicing operation of the carrier tape 100 is effected for not only the tape feeder 410 whose electronic components have been used, but also any other rape feeders 410 in which the numbers of the remaining electronic components are smaller than a predetermined lower limit that is comparatively large.

The replacement of the tape feeders 410 in the present embodiment will be described. In the first embodiment, the operator assisting apparatus 200 is arranged such that the first and second irradiating devices 202, 204 of the indicator-detector unit 208 corresponding to the tape feeder 20 to be replaced are both turned on and off. In the present second embodiment, however, the two irradiating devices 202, 204 controlled independently of each other as described below, by reference to the flow chart of FIG. 14 illustrating a feeder replacement assisting program.

The feeder replacing assisting program of FIG. 14 is executed when the control device 300 has detected in the main control routine that all of the electronic components in a given tape feeder 410 have been used or that the number of the electronic components remaining in the tape feeder 410 has become smaller than the lower limit. The feeder replacement assisting program is initiated with step S401 to determine whether a flag F6 is set at "1". If an affirmative decision (YES) is obtained in step S401, the control flow goes to step S402 to determine that it is necessary to replace the tape feeder 410. Step S402 is followed by step S403 to move the component mounting head 450 from the electronic-component supply device 406, 408 including the relevant tape feeder 410, to the other supply device 406, 408. Then, the control flow goes to step S404 to turn on the first irradiating device 202 of the relevant indicator-detector unit 208 for irradiating a portion of the relevant tape feeder 410 with a visible light, so that the tape feeder 410 to be replaced is indicated by the visible light. Step S404 is further formulated to set the flag F6 to "1", so that steps S402–S404 are subsequently skipped. Step S404 is followed by step S405 to determine whether a flag F7 is set at "0". If an affirmative decision (YES) is obtained in step S405, the control flow goes to step S406 to determine whether the relevant tape feeder 410 has been removed. When the relevant tape feeder 410 has been removed by the operator, the photoelectric sensor 222 of the relevant indicator-detector unit 208 generates a signal indicating that the relevant tape feeder 410 has been removed. As a result, an affirmative decision (YES) is obtained in step S406, and the control flow goes to step S407 to turn off the first irradiating device 202 and turn on the second irradiating device 204. Because the visible light emitted by the second irradiating device 204 is visible through the through-hole 165 of the relevant slot 180, operator can recognize that the relevant tape feeder 410 has been removed from the relevant slot 180. Step S407 is further formulated to reset the flag F7 to "1" so that steps S406 and S407 are subsequently skipped. If the wrong tape feeder 410 has been removed, the photoelectric sensor 222 corresponding to the wrong tape feeder 410 generates a signal indicating that this tape feeder 410 has been erroneously removed. As a result, a negative decision (NO) is obtained in step S406, and the control flow goes to step S408 to activate the irradiating devices 202, 204 corresponding to the wrong tape feeder 410 or slot 180, such that the irradiating devices 202, 204 flicker to informing the operator of the removal of the wrong tape feeder 410.

The position of the slot 180 in which the new tape feeder 410 is to be mounted is indicated by the visible light which is emitted by the corresponding second irradiating device 204 and which is visible through the corresponding through-hole 165. Accordingly, the operator is informed of the position of the relevant slot 180 in which the new tape feeder 410 is to be mounted. Step S407 is followed by step S409 to determine whether the bar code attached to the new tape feeder 410 identifies the identification number of the relevant slot 180, and step S410 to determine whether the new tape feeder 410 has been mounted in the relevant slot 180. If the new tape feeder 410 has been mounted in the relevant slot 180, this fact is detected by the photoelectric sensor 222 of the corresponding feeder-mounting device 206. If an affirmative decision (YES) is obtained in steps S409 and S410, the control flow goes to step S411 to turn off the second irradiating device 204, and reset the flags F6 and F7 to "0". Thus, the operator can confirm that the new tape feeder 410 has been mounted in the relevant slot 180. One cycle of execution of the program of FIG. 14 is terminated with step S411. If the wrong new tape feeder 410 has been mounted in the relevant slot 180 or if the relevant new tape feeder 410 has been mounted in the wrong slot 180, that is, if a negative decision (NO) is obtained in one of steps S409 and S410, the control flow goes to step S408 in which the irradiating devices 202, 204 corresponding to the wrong tape feeder 410 or slot 180 are activated so as to irradiate. Thus, the operator is informed of the erroneous mounting of the new tape feeder 410. Where the new tape feeder 410 has been mounted in the wrong slot 180, the second irradiating device 204 is in the on state so that the operator can easily recognize the position of the correct slot 180 in which the new tape feeder 410 should be re-mounted.

Figure 13:
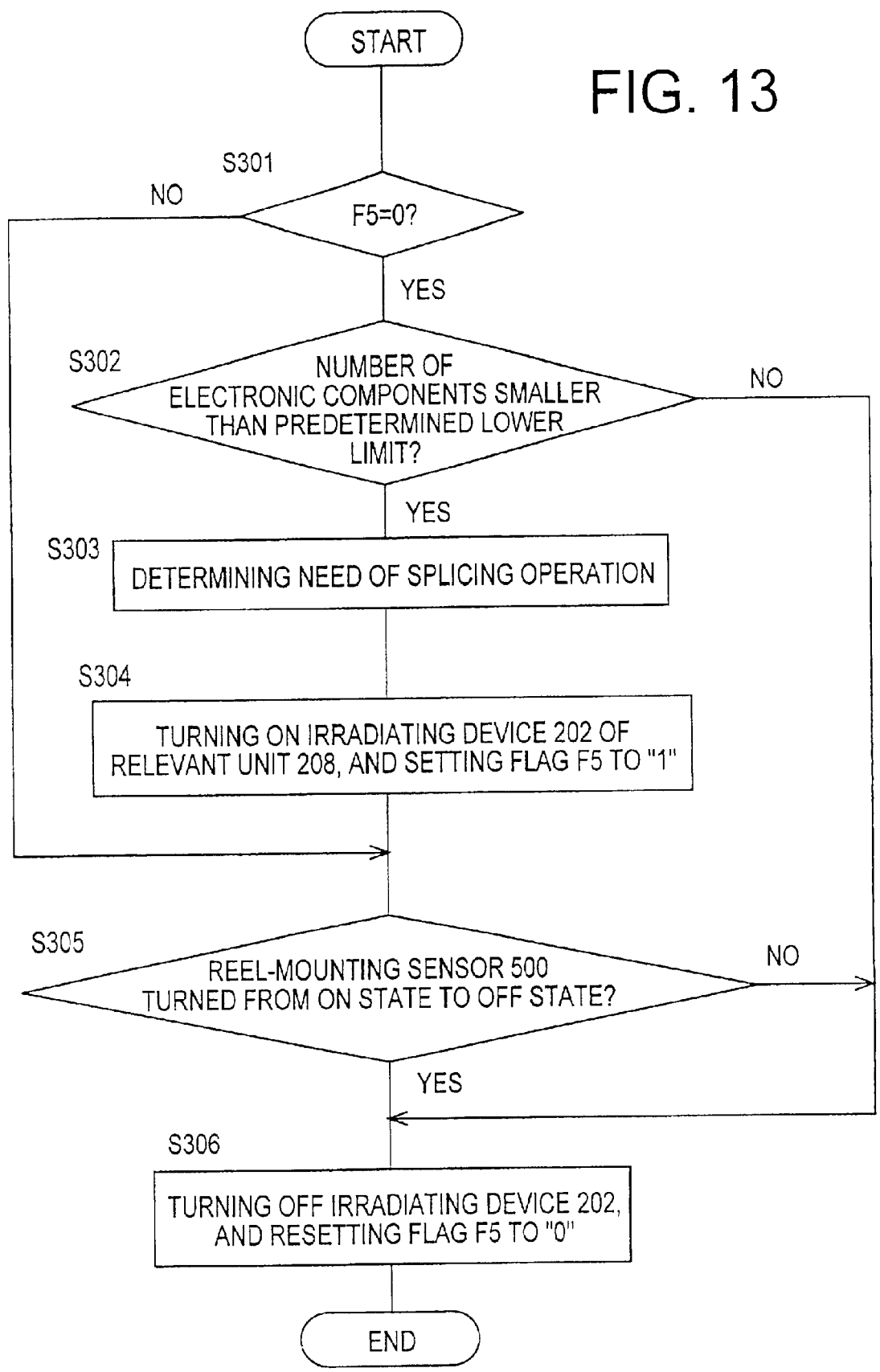
FIG. 13 is a flow chart illustrating a tape splicing assisting program stored in the computer of the control device of the system of FIG. 9.

It will be understood from the foregoing description of the present second embodiment that each of the covering-tape storage volume sensor 474 and the reel-mounting sensor 500 constitutes a need detecting device operable to detect a need of performing an intermediate manual working operation, and that a portion of the control device 300 assigned to implement steps S203–S205 of FIG. 12 and steps S304–306 of FIG. 13 constitutes an intermediate-operation checking and indicating device. It will also be understood that a portion of the control device 300 assigned to implement steps S408 and S410 of FIG. 14 constitutes a mounting-position checking and indicating device, while a portion of the control device 300 assigned to implement steps S406 and S408 of FIG. 14 constitutes a removing-position checking and indicating device.

In the electronic-component mounting system according to the present second embodiment, the electronic-component supply devices 406, 408 are held stationary, so that the manual working operations in connection with the tape feeders 410 can be performed at the component supply position at which the electronic components are supplied to the component mounting head 450 and mounted on the printed-wiring board 16. As described above, the component mounting head 450 is moved from the presently used one of the electronic-component supply devices 406, 408 to the other electronic-component supply device 406, 408, when a need of replacement of any tape feeder 410 on the presently used supply device 406, 408 is detected. Thus, the replacement of the relevant tape feeder 410 is effected while the supply device 406, 408 including this relevant tape feeder 410 is at rest. On the other hand, the removal of the covering tape 102 from the storage container 468 and the splicing of the carrier tapes 100 are effected on the presently used supply device 406, 408, without moving the component mounting head 450 to the other supply device 406, 408. However, at least one of those intermediate working operations, for example, the removal of the covering tape 102 may be effected on the presently used supply device 406, 408 after the component mounting head 450 is moved to the other supply device 406, 408, so that the removal of the covering tape 102 is effected while the supply device 406, 408 including the relevant tape feeder 410 is at rest.

In the second embodiment described above, the tape feeder 410 on which the intermediate working operation is required to be performed is indicated by only the first irradiating device 202 of the indicator-detector unit 208 corresponding to that tape feeder 410. However, a suitable monitoring display may be provided to indicate the specific intermediate working operation (the operation to remove the covering tape 102 or the operation to splice the carrier tapes 100). Where the need of the intermediate working operation is indicated so as to permit the operator to recognize the kind of the intermediate working operation, the operation can be more easily performed by the operator with improved efficiency and stability. A monitoring display may be provided to indicate the identification number of the tape feeder 410 to be replaced.

Although the two electronic-component supply devices 406, 408 are provided in the second embodiment, the electronic-component mounting system may be provided with only one of the two supply devices 406, 498. In this case, the intermediate working operations can be performed while the supply device is in operation to supply the electronic components to be mounted on the printed-wiring board 16. However, the replacement of the tape feeders 410 is preferably performed while the operation to mount the electronic components on the board 16 is interrupted.

While the presently preferred embodiments of the present invention have been described in detail, for illustrative purpose only, it is to be understood that the present invention may be embodied with various changes and improvements, such as those described in the SUMMARY OF THE INVENTION, which may occur to those skilled in the art.

What is claimed is:

1. An operator assisting apparatus for assisting an operator of an electric-component supply device including a plurality of component feeders and a feeder support on which the component feeders are mounted at respective feeder-mounting positions, each of said component feeders accommodating a plurality of electric components of a specific kind and being arranged to successively supply the electric components one after another, the electric-component supply device being arranged to supply from the component feeders, the electric components to an electric-component mounting device which is arranged to mount the electric components on at least one printed wiring board, said operator assisting apparatus being arranged to assist the operator in performing at least one manual working operation selected from the group consisting of (i) an operation to mount each one of the component feeders on said feeder support, (ii) an operation to remove said each one of the component feeders from said feeder support, and (iii) an intermediate operation to be performed in connection with said each one of the component feeders, during a time period between moments of respective operations to mount and remove said each component-feeder on and from the feeder support, said operator assisting apparatus comprising:

next-operation determining means for determining, based on an operating state of at least one of the electric component supply device and the electric component mounting device, the manual working operation which should be performed next by the operator, and the component feeder for which the determined manual working operation should be performed next, the determined manual working operation being one of the operation to mount the determined component feeder on the feeder support, the operation to remove the determined component feeder from said feeder support, and the intermediate operation in connection with the determined component feeder;

at least one of (a) a position indicator operable to indicate at least one of (i) the feeder-mounting position at which the determined component feeder is to be mounted next on said feeder support and (ii) the feeder-mounting position at which the determined component feeder has been removed last from said feeder support, and (b) a feeder indicator operable to indicate at least one of (i) the determined component feeder which has been mounted last on said feeder support, (ii) the determined component feeder which is to be removed next from said feeder support and (iii) the determined component feeder on which said intermediate operation is required to be performed.

2. The operator assisting apparatus according to claim 1, which comprises said position indicator, to assist the operator in performing said operation to mount the determined component feeder on said feeder support.

3. The operator assisting apparatus according to claim 1, further comprising a mounting-position checking and indicating device for effecting a determination as to whether the component feeder mounted last on said feeder support has been mounted at a correct one of said feeder-mounting positions, and for indicating in a human recognizable manner a result of said determination.

4. The operator assisting apparatus according to claim 3, which comprises said feeder indicator, and wherein said mounting-position checking and indicating device utilizes said feeder indicator, to indicate said result of said determination.

5. The operator assisting apparatus according to claim 4, wherein said mounting-position checking and indicating device is operable to control said feeder indicator to be operable in a last-mounting manner upon a last-mounting determination that said component feeder mounted last on said feeder support has been mounted at said correct feeder-mounting position, and in a non-last-mounting manner different from said last-mounting manner, upon a non-last-mounting determination that the component feeder mounted last on said feeder support has not been mounted at said correct feeder-mounting position.

6. The operator assisting apparatus according to claim 1, which comprises said feeder indicator, to assist the operator in performing said operation to remove the determined component feeder from said feeder support.

7. The operator assisting apparatus according to claim 1, which comprises said position indicator, and further comprises a removing-position checking and indicating device operable to control said position indicator to be operable in a removing manner upon a removing determination that said component feeder removed last from said feeder support has been removed from a correct one of said feeder-mounting positions, and in a non-removing manner different from said removing manner, upon a non-removing determination that the component feeder removed last from said feeder support has not been removed from said correct feeder-mounting position.

8. The operator assisting apparatus according to claim 1, which comprises said feeder indicator, to assist the operator in performing said intermediate operation in connection with the determined component feeder.

9. The operator assisting apparatus according to claim 1, which comprises said feeder indicator, and further comprises:
   a need detecting device operable to detect a need of performing said intermediate operation;
   an operation detecting device operable to detect that said intermediate operation has been performed in connection with any one of said component feeders; and
   an intermediate-operation checking and indicating device operable according to an output of said need detecting device, to control said feeder indicator for indicating the component feeder in connection with which said intermediate operation has been performed, such that said feeder indicator is operable in an intermediate manner upon an intermediate determination that said intermediate operation has been performed at a correct one of said feeder-mounting positions, and in a non-intermediate manner different from said intermediate manner, upon a non-intermediate determination that said intermediate operation has not been performed at said correct feeder-mounting position.

10. The operator assisting apparatus according to claim 1, which comprises said feeder indicator, and further comprises:
   a need detecting device operable to detect a need of performing said intermediate operation;
   an operation detecting device operable to detect that said intermediate operation has been performed in connection with any one of said component feeders; and
   an intermediate-operation checking and indicating device operable according to an output of said need detecting device, to control said feeder indicator to be operable in a needing manner upon a needing determination that the intermediate operation which has been performed is said intermediate operation the need of which has been detected by said need detecting device, and in a non-needing manner different from said needing manner, upon non-needing determination that the intermediate operation which has been performed is different from said intermediate operation the need of which has been detected by said need detecting device.

11. The operator assisting apparatus according to claim 1, wherein said next-operation determining means includes need detecting means for detecting a need of performing at least one of said operation to mount any one of said component feeders at the corresponding feeder-mounting position, said operation to remove any one of said component feeders mounted at the corresponding feeder-mounting position, and said intermediate operation in connection with any one of said component feeders.

12. The operator assisting apparatus according to claim 1, wherein said plurality of component feeders are provided with respective sets of feeder-identification data identifying the component feeders, respectively, and said next-operation determining means includes:
   feeder-identification-data obtaining means for obtaining said sets of feeder-identification data of said component feeders; and
   operation-data storing means for storing operation data indicative of the manual working operation to be performed by the operator in connection with the component feeder whose set of feeder-identification data has been obtained by said feeder-identification-data obtaining means,
   and wherein said next-operation determining means determines the manual working operation represented by said operation data stored in said operation-data storing means, as said manual working operation which should be performed next in connection with the component feeder whose set of feeder-identification data has been obtained by said feeder-identification-data obtaining means.

13. The operator assisting apparatus according to claim 1, wherein said feeder support is provided with sets of position-identification data representative of said plurality of feeder-mounting positions, respectively, and said next-operation determining means includes:
   position-identification-data obtaining means for obtaining said sets of position-identification data of said feeder-mounting positions; and
   operation-data storing means for storing operation data indicative of the manual working operation to be performed by the operator at the feeder-mounting position represented by the set of position-identification data obtained by said position-identification-data obtaining means,
   and wherein said next-operation determining means determines the manual working operation represented by said operation data stored in said operation-data storing means, as said manual working operation which should be performed next at the feeder-mounting position represented by the set of position-identification data obtained by said position-identification-data obtaining means.

14. The operator assisting apparatus according to claim 1, wherein at least one of said position indicator and said feeder indicator includes an optical indicator for indicating the feeder-mounting position or the component feeder, by generation of a light.

15. The operator assisting apparatus according to claim 14, wherein said optical indicator includes at least one of an irradiating device operable to irradiate an object with the light, and a light-emitting device disposed on an object and operable to emit the light.

16. The operator assisting apparatus according to claim 1, which comprises the position indicator operable to indicate the feeder-mounting position at which said determined component feeder is to be mounted next on the feeder support, wherein the feeder support is provided with sets of position-identification data representative of the plurality of feeder-mounting positions, respectively, and the plurality of component feeders are provided with respective sets of feeder-identification data identifying the component feeders, respectively, the operator assisting apparatus further comprises:
  position-identification data obtaining means for obtaining the set of position-identification data representing the feeder-mounting position at which said determined component feeder is to be mounted next on the feeder support, so that the position indicator indicates the feeder-mounting position represented by the set of position-identification data obtained by the position identification data obtaining means;
  a feeder-identification-data obtaining device which obtains the set of feeder-identification data of one of the component feeders that is selected by the operator; and judging means for judging whether the obtained set of feeder-identification data matches the obtained set of position-identification data, wherein when the judging means judges that the obtained set of feeder-identification data matches the obtained set of position-identification data, the position indicator indicates, in a next-mounting manner, the feeder-mounting position at which said determined component feeder is to 1e mounted next on the feeder support, and when the judging means judges that the obtained set of feeder-identification data does not match the obtained set of position-identification data, the position indicator indicates, in a non-next-mounting manner different from the next-mounting manner, the feeder-mounting position at which said determined component feeder is to be mounted next on the feeder support.

17. The operator assisting apparatus according to claim 1, wherein said at least one of the position indicator and the feeder indicator indicates a corresponding one of the determined feeder-mounting position and the determined component feeder, to the operator in a human recognizable manner.

* * * * *